(12) United States Patent
Siles Perez et al.

(10) Patent No.: US 9,143,084 B2
(45) Date of Patent: Sep. 22, 2015

(54) ON-CHIP POWER-COMBINING FOR HIGH-POWER SCHOTTKY DIODE BASED FREQUENCY MULTIPLIERS

(75) Inventors: Jose Vicente Siles Perez, Pasadena, CA (US); Goutam Chattopadhyay, Pasadena, CA (US); Choonsup Lee, La Palma, CA (US); Erich T. Schlecht, Pasadena, CA (US); Cecile D. Jung-Kubiak, Pasadena, CA (US); Imran Mehdi, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 288 days.

(21) Appl. No.: 13/595,964

(22) Filed: Aug. 27, 2012

(65) Prior Publication Data

US 2013/0229210 A1  Sep. 5, 2013

Related U.S. Application Data

(60) Provisional application No. 61/527,506, filed on Aug. 25, 2011.

(51) Int. Cl.
*H03B 19/16* (2006.01)
*H01L 27/08* (2006.01)
(Continued)

(52) U.S. Cl.
CPC ............. *H03B 19/16* (2013.01); *H01L 21/77* (2013.01); *H03B 19/18* (2013.01); *H01L 23/66* (2013.01); *H01L 27/0814* (2013.01);
(Continued)

(58) Field of Classification Search
CPC ........ H03B 19/05; H03B 19/14; H03B 19/16; H03B 19/18

USPC ................................................... 333/218, 248
See application file for complete search history.

(56) References Cited

U.S. PATENT DOCUMENTS 6,476,692 B2 * 11/2002 Uchino ......................... 333/218
6,998,941 B2 * 2/2006 Maltsev et al. ............... 333/218
(Continued)

OTHER PUBLICATIONS

Maestrini et al., "A Frequency-Multiplied Source With More Than 1mW of Power Across the 840-900-GHz Band", IEEE Trans. on Microwave Theory and tech., vol. 58, No. 7, pp. 1925-1931, Jul. 2007.
Mehdi et al., "High-power local oscillator sources for 1-2 THz", in Proc. SPIE, 7741, 774112, 2010.
Chattopadhyay et al., "Development of Multi-Pixel Heterodyne Array Instruments at Submillimeter Wavelengths", Proc. of the Asia Pacific Micro. Conf., Dec. 2004.
(Continued)

*Primary Examiner* — Dean Takaoka
*Assistant Examiner* — Alan Wong
(74) *Attorney, Agent, or Firm* — Gates & Cooper LLP

(57) ABSTRACT

A novel MMIC on-chip power-combined frequency multiplier device and a method of fabricating the same, comprising two or more multiplying structures integrated on a single chip, wherein each of the integrated multiplying structures are electrically identical and each of the multiplying structures include one input antenna (E-probe) for receiving an input signal in the millimeter-wave, submillimeter-wave or terahertz frequency range inputted on the chip, a stripline based input matching network electrically connecting the input antennas to two or more Schottky diodes in a balanced configuration, two or more Schottky diodes that are used as nonlinear semiconductor devices to generate harmonics out of the input signal and produce the multiplied output signal, stripline based output matching networks for transmitting the output signal from the Schottky diodes to an output antenna, and an output antenna (E-probe) for transmitting the output signal off the chip into the output waveguide transmission line.

18 Claims, 18 Drawing Sheets

(51) Int. Cl.
H01L 21/77 (2006.01)
H03B 19/18 (2006.01)
H01L 23/66 (2006.01)

(52) U.S. Cl.
CPC ............... *H01L 2223/6627* (2013.01); *H01L 2223/6677* (2013.01); *H01L 2223/6683* (2013.01); *H01L 2224/48091* (2013.01); *H01L 2924/12032* (2013.01); *H03B 2200/0032* (2013.01); *H03B 2200/0076* (2013.01)

(56) References Cited

U.S. PATENT DOCUMENTS

| 8,466,832 B2 * | 6/2013 | Afshari et al. | 342/175 |
|---|---|---|---|
| 8,680,898 B2 * | 3/2014 | Tsukashima | 327/116 |
| 8,686,813 B2 * | 4/2014 | Deal et al. | 333/248 |
| 8,841,944 B1 * | 9/2014 | Lee et al. | 327/119 |

OTHER PUBLICATIONS

Siles et al., "A Single-Waveguide In-Phase Power-Combined Frequency Doubler at 190 GHz", IEEE Microwave and Wireless Components Letters, vol. 21, No. 6, pp. 332-334, Jun. 2011.

Jung et al., "Silicon Micro-Machining Technology for THz Applications", 35th Int. Conf. on Infrared, Millimeter and Terahertz waves, Sep. 2010.

Maestrini et al., "A 540-640 GHz high Efficiency Four Anode Frequency Tripler", IEEE Trans. Microwave Theory Tech., vol. 53, pp. 2835-2842, Mar. 2008.

Maestrini et al., "In-Phase Power-Combined Frequency Triplers at 300 GHz", IEEE Microwave and Wireless Component Letters, vol. 18, No. 3, pp. 218-220, Mar. 2008.

* cited by examiner

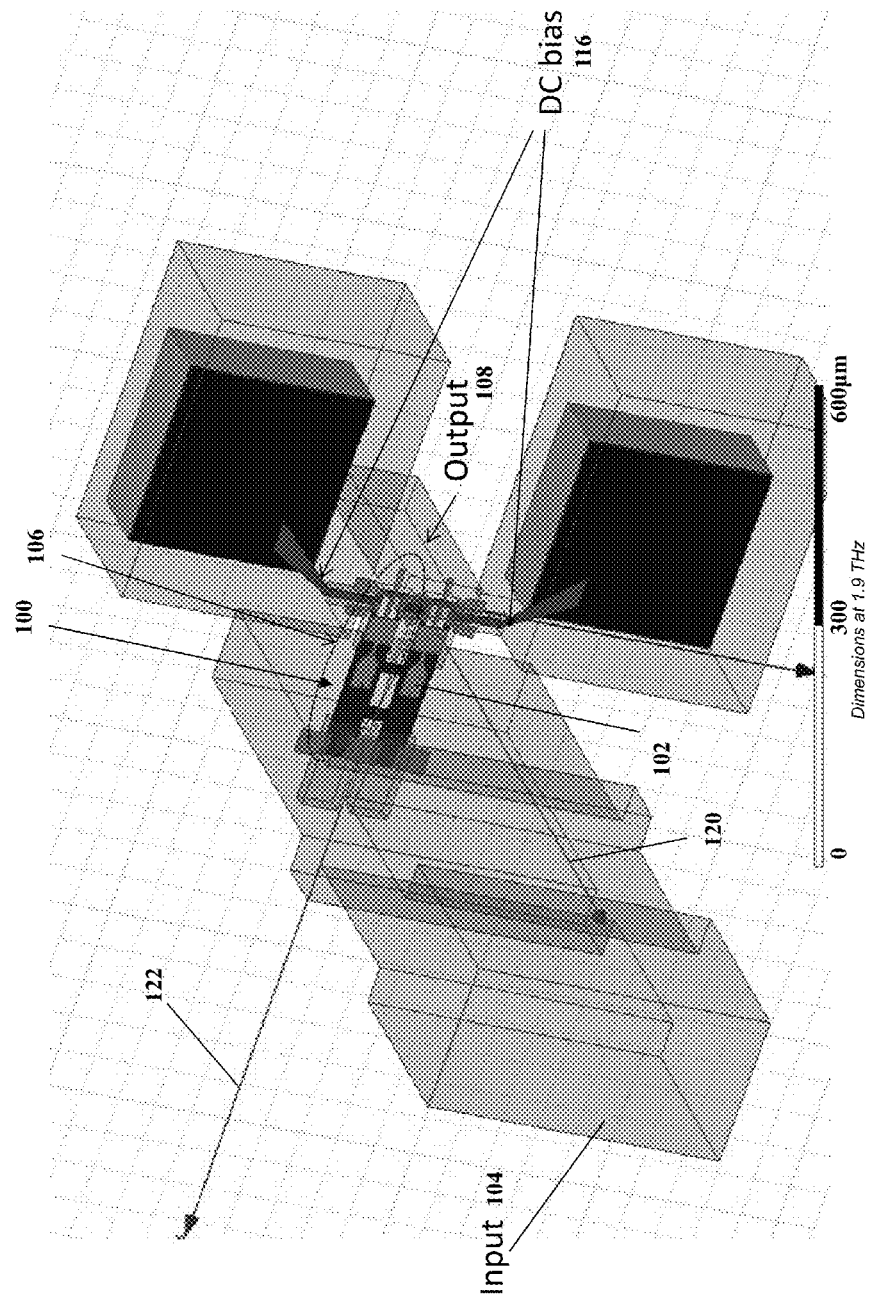

ON-CHIP POWER-COMBINING FOR HIGH-POWER SCHOTTKY DIODE BASED FREQUENCY MULTIPLIERS

CROSS REFERENCE TO RELATED APPLICATIONS

This application claims the benefit under 35 U.S.C. Section 119(e) of the following co-pending and commonly-assigned application:

U.S. Provisional Patent Application Ser. No. 61/527,506, filed on Aug. 25, 2011, by Goutam Chattopadhyay, Imran Mehdi, Erich T. Schlecht, Choonsup Lee, Jose V. Siles, Alain E. Maestrini, Bertrand C. Thomas, Cecile D. Jung, entitled "ON-CHIP POWER-COMBINING FOR HIGH-POWER SCHOTTKY DIODE BASED FREQUENCY MULTIPLI-ERS," which application is incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to on-chip power combining for high-power Schottky diode based frequency multipliers.

2. Description of the Related Art.

(Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Solid-state multiplied local oscillator (LO) sources based on Schottky diode technology have been by far the preferred devices to drive the heterodyne receivers on imaging radars for concealed weapons detection and on-board planetary science and astrophysics space missions at submillimeter-waves and terahertz (THz) frequencies. The first generation of room-temperature Schottky multiplied LO sources exhibited up to 2 microwatts ($\mu$W) at 1.9 THz frequency (highest band of the HIFI instrument of the Herschel Space Observatory) by frequency multiplying from the available 100-150 milliwatt (mW) LO sources at W-band frequencies (75-100 Gigahertz, GHz) up to terahertz frequencies using a +2+3+3 (doubler, tripler, tripler) cascaded-multiplier configuration.

The recent progress in GaN-based power amplifier technology has recently demonstrated output power levels in excess of 5 Watts (W) from power amplifiers at W-band frequencies, making it now possible to conceive solid-state multiplied sources beyond 2 or 3 THz [2], as well as to develop multi-pixel heterodyne instruments for ground and space based applications in the THz range [3]. The increasing output power at W-band, together with the use of high-thermal conductivity substrates and power-combining schemes to increase the number of chips within the multipliers, have already led to world-record measured output powers up to 1.4 milliwatts (mW) at 0.9 THz, 60 microwatts ($\mu$W or uW) at 1.9 THz [1], and 18 $\mu$W at. 2.54 THz at the Jet Propulsion Laboratory (JPL). Using the novel GaN amplifier chains, power levels up to 10 mW at 600 GHz and >0.1 mW at 1.9 THz are envisioned using all-solid-state frequency multiplied sources.

Since the maximum power handled by a single chip is generally limited by the number of diodes in the chip, a number of multiplier chips need to be power-combined in order to make it possible to handle high amounts of power at the input and subsequently produce superior power levels at the output. However, the use of traditional power-combining topologies, already demonstrated below 1 THz, presents inconvenience beyond 1 THz. On the one hand, the use of Y-junction to divide/combine the input/output power at these frequency bands unnecessarily increases the electrical path of the signal at a range of frequencies where waveguide losses are considerably high. On the other hand, guaranteeing a perfect alignment of the very small chips during assembly, in order to preserve the balanced nature of the multiplier, is practically impossible, with a subsequent impact on the multiplier performance. Hence, novel power-combining schemes are very necessary in order to increase the power-handling capabilities of high-frequency multipliers, while preserving the multiplier circuit performance. The present invention satisfies this need.

SUMMARY OF THE INVENTION

One or more embodiments of the invention disclose a Monolithic Microwave

Integrated Circuit (MMIC) multiplier device, comprising: two or more multiplying structures integrated on a single chip, wherein each of the integrated multiplying structures are electrically identical and each of the multiplying structures include one input antenna (E-probe) for receiving an input signal inputted on the chip, a stripline based input matching network electrically connecting the input antennas to two or more Schottky diodes, two or more Schottky diodes that are used as nonlinear semiconductor devices to generate harmonics out of the input signal and produce the multiplied output signal, stripline based output matching networks for transmitting the output signal from the Schottky diodes to an output antenna, and an output antenna (E-probe) for transmitting the output signal off the chip into the output waveguide transmission line.

The factor of improvement in terms of power handling capabilities and output power with regards to traditional frequency multiplier devices is directly proportional to the number of multiplying structures included on the on-chip power-combined MMIC device.

The frequency of the input signal can be W-band or higher, i.e. within the terahertz range (100 GHz-3 THz). The output frequency can be twice or three times the input signal depending on the multiplier type. The MMIC multiplier device features one antenna (E-probe) per multiplying structure. The 2 or more antennas of the whole chip are symmetrically placed within the plane normal to the propagation of the incident electrical field (TE10 mode of the input waveguide). The 2 or more antennas thereby split evenly the incident power among the 2 or more multiplying structures included on the same MMIC chip.

Two or more Schottky diodes are included in each of the multiplying structures symmetrically placed within the chip plane along the direction of the E-field vector so that the power is delivered in-phase to the diodes. The diodes are connected to the input antennas or E-probes through metal stripline transmission lines that provide the diodes with optimum power matching. The position of the diodes within each of the multiplying structures is optimized so that each of the diodes receives an equal part of the input power. The number of diodes included in the MMIC chip is defined by the specific frequency of operation, the desired bandwidth and the nominal input power of operation, but can be 2 or more per multiplying structures, i.e. four or more diodes total in the whole chip assuming a dual-multiplier configuration and 8 or more diodes total in the whole chip if the quad configuration. The nonlinear nature of the capacitance vs. voltage and/or the resistance vs. voltage characteristics of the diodes generate harmonics of the input signal. The position of the diodes and circuit matching elements are designed to enhance the power at the second harmonic for a frequency doubler or the third harmonic for a frequency tripler.

The Schottky diodes are electrically connected to output antennas or E-probes by means of stripline based matching elements that guarantee that most of the power generated by the diodes at two times the frequency of the input signal (2×100 GHz or more for a doubler, or 3×100 GHz or more for a tripler) is transferred off the integrated circuit to the output waveguide.

Accordingly to the definitions above, the integrated circuit (MMIC device) has a pattern that is symmetric about at least two axes passing through a central point of the integrated circuit within the plane normal to the propagation of the incident submillimeter-wave or terahertz electrical field.

The MMIC multiplier devices including the 2 or more multiplying structures can be lithographically patterned (e.g., using photolithography, Monolithic Microwave Integrated Circuit (MMIC) lithography, metal deposition, etc.) on a Gallium Arsenide (typical), Quartz, Silicon carbide, Indium Phosphide diamond, Gallium nitride or any other material wafer.

The device further comprises additional stripline metallizations that provide the chip with dc bias connections for each of the two or more multiplying structures, which are used to optimize the performance of the chip for high input power levels, as well as appropriate ground connections to a waveguide block where the chips are assembled.

Therefore, the device further comprises one input submillimeter-wave or terahertz waveguide structure that couples the submillimeter-wave or terahertz signal to the input antennas included in the MMIC. The input waveguide structure includes additional input matching elements to guarantee a wide frequency bandwidth of operation for the on-chip power-combined frequency multiplier. Using the same concept, two output waveguides receive the output frequency multiplied signal from the output antennas within the chip and transmit the signal of the multiplier block. Each of the output waveguides receives one half of the total output power produced in the multiplier chip. The chips is placed in a small waveguide channel between the input and output waveguides.

The waveguide housing for the chip can be done using either very thin metal plates (typically 3 millimeter (mm)-thick or less gold plated brass plates) or very thin metal plated (typically gold plated) silicon wafers vertically stacked along the axis perpendicular to the on-chip power-combined device plane. The complete multiplier housing block can comprise a plurality of aligned, stacked, and fastened/attached together silicon or metal plates featuring the input and output waveguide matching structures, the waveguide channel where the chip is assembled, the bias circuitry, via holes for alignment pins, screw holes, and input and output waveguide flanges to provide the multiplier block with appropriate connectivity to other circuits.

Silicon-based housing blocks are typically employed for input frequencies of 300 GHz or higher since the thickness of each of the plates that forms the stacked block can be less than 2 mm-thick. This thickness is defined by the length of the input/output waveguide matching sections, which depends on the operation frequency. Metal plates thinner than 3 mm are very hard to machine using conventional CNC machining techniques.

The total thickness of the multiplier device including the input waveguide, output waveguides and the integrated circuit, along a longitudinal axis of the input waveguide and output waveguides, can be less than five micrometers.

The total dimension of the multiplier device including the input waveguide, output waveguides and the integrated circuit, along a longitudinal axis of the input waveguide and output waveguides, can be less than 1 millimeter×1 millimeter.

The invention can be applied to frequency multipliers at any frequency of operation. For example, frequency triplers have been designed and fabricated at the Jet Propulsion Laboratory with the following characteristics:

(a) 550 GHz on-chip power combined frequency tripler on a quad-configuration comprising four multiplying structures with 2 diodes each, center frequency of operation (output): 550 GHz, frequency bandwidth of at least 15%, input power 100 mW, output conversion efficiency: 5-7%, output power 5-7 mW;

(b) 650 GHz on-chip power combined frequency tripler on a quad-configuration comprising four multiplying structures with 2 diodes each, center frequency of operation (output): 650 GHz, frequency bandwidth of at least 15%, input power 100 mW, output conversion efficiency: 5-7%, output power 5-7 mW;

(c) 650 GHz on-chip power combined frequency tripler on a dual-configuration comprising two multiplying structures with 2 diodes each, center frequency of operation (output): 650 GHz, frequency bandwidth of at least 15%, input power 50 mW, output conversion efficiency: 5-7%, output power 2.5-3.5 mW;

(d) 1600 GHz on-chip power combined frequency tripler on a quad-configuration comprising four multiplying structures with 2 diodes each, center frequency of operation (output): 1600 GHz, frequency bandwidth of at least 15%, input power 32 mW, output conversion efficiency: 2-3%, output power 0.65-1 mW;

(e) 1900 GHz on-chip power combined frequency tripler on a quad-configuration comprising four multiplying structures with 2 diodes each, center frequency of operation (output): 1900 GHz, frequency bandwidth of at least 15%, input power 4 mW, output power 20-22 uW;

(f) 1900 GHz on-chip power combined frequency tripler on a dual-configuration: Two multiplying structures with 2 diodes each, center frequency of operation (output): 1900 GHz, frequency bandwidth of at least 15%, input power 2 mW, output power 10-12 μW.

The method can further comprise obtaining/fabricating one or more machined silicon fasteners (e.g., silicon pins), wherein the silicon wafers are fastened/attached together with the integrated circuit between the input waveguide and the output waveguides, by insertion of the machined silicon fasteners into the fastening holes in each of the silicon wafers.

In one embodiment of the present invention, a novel concept for on-chip power-combined high-power frequency multipliers featuring two or more multiplying structures integrated on a single-chip with the input and output waveguides perpendicular to the waveguide channels is described. The input power is equally divided in-phase by two or more E-probes located at the input waveguide. The produced output power is recombined at the output using the same concept. Each of the two individual waveguide outputs provide one half of the total power generated from the input signal. The improvement factor in input/output power is directly proportional to the number of multiplying structures included in the chip.

BRIEF DESCRIPTION OF THE DRAWINGS

Referring now to the drawings in which like reference numbers represent corresponding parts throughout:

FIG. 1(c) illustrates an on chip power combining scheme and input and output waveguides for generating 1.9 THz using two on-chip multiplying structures and four Schottky diodes total, according to one or more embodiments of the invention;

DETAILED DESCRIPTION OF THE INVENTION

Figure 1A:
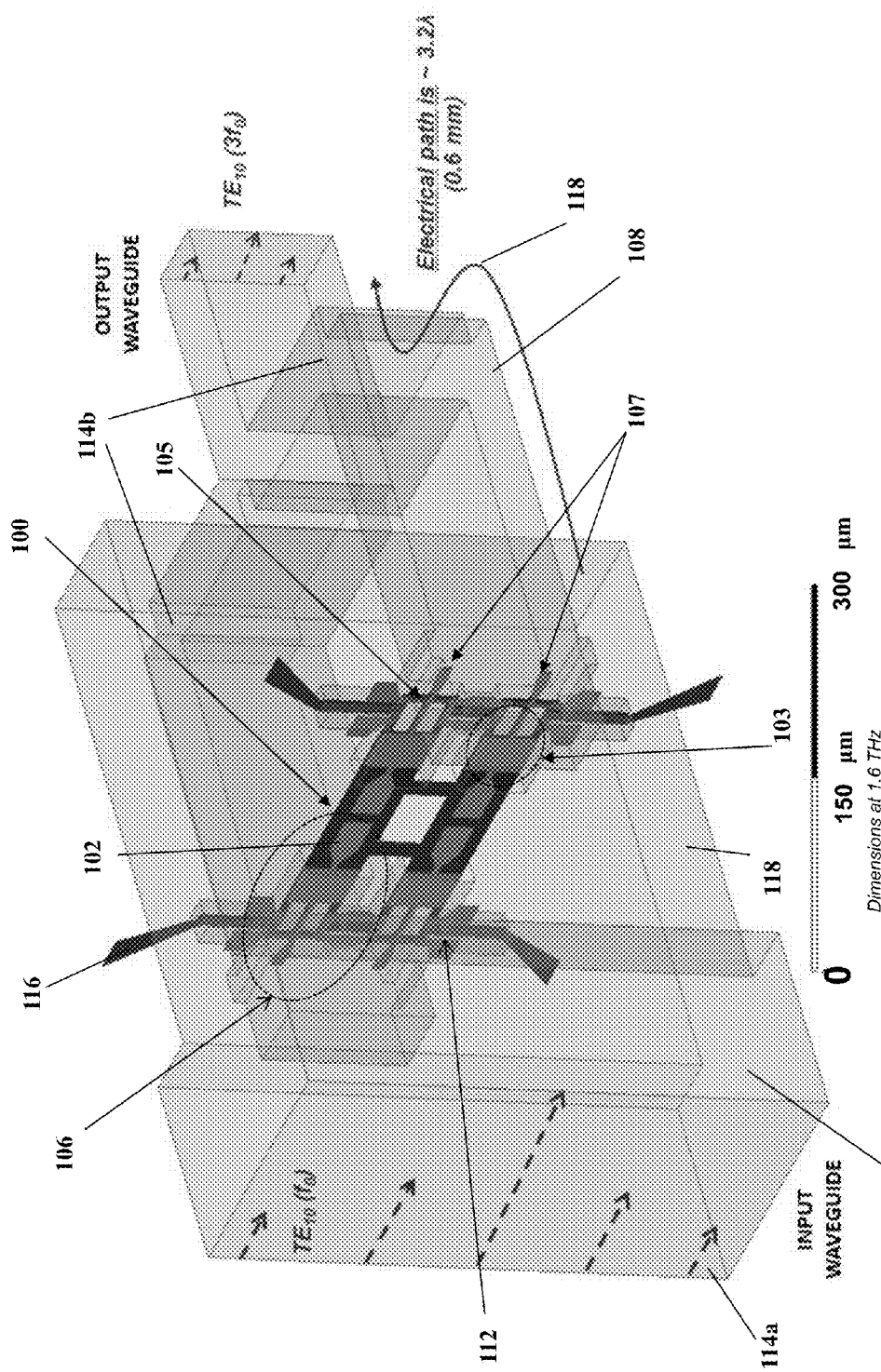
FIG. 1(a) is an 'on-chip' power combining scheme for frequency multipliers, according to one or more embodiments of the invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

In spite of the fact that some specific circuit designs at certain operation frequencies within the submillimeter-wave and terahertz ranges are used as reference to describe the invention, the described topology is applicable to any frequency range, input power levels, number of diodes and bias condition. All these different conditions shall be covered with the present patent application.

Technical Description

One or more embodiments of the present invention disclose a novel power-combined Schottky frequency multiplier topology intended to increase by a number of 2 or more the power handling capabilities of traditional single-chip frequency multipliers. The design of Schottky based multipliers at these frequency ranges is mainly constrained by the shrinkage of the waveguide dimensions with frequency and the minimum diode mesa sizes, which limits to two the maximum number of diodes per chip. Hence, multiple chip power-combined schemes become necessary to increase the power-handling capabilities of high frequency multipliers. However, the use of traditional power-combining topologies already demonstrated at frequencies below 1 THz [1, 4] presents several challenges for frequencies beyond 1 THz. On the one hand, the use of several Y-junctions or hybrid couplers to divide/combine the input/output power at these frequency bands increases unnecessarily the electrical path of the signal at a range of frequencies where the waveguide losses are considerably high. On the other hand, guaranteeing a perfect alignment of the very small chips during assembly in order to preserve the balanced nature of the multiplier is practically impossible, with the subsequent impact on the multiplier performance.

FIG. 1(a-d) illustrates the novel 'on-chip' power combining scheme for frequency multipliers which overcomes these difficulties by performing the power-combining directly 'on-chip' 100 instead of using different chips. The main principle of operation lies in the fact that on-chip power dividing/combining is possible if two or more identical E-probes (or antennas), four in the example in FIG. 1(a-b) and two in the example in FIG. 1(c-d) 102, symmetrically placed around the center of the input waveguide 104 are in-phase with the incident electrical field (TE10 mode of the waveguide). To achieve this, the longitudinal axis of the input/output waveguide must be perpendicular to the chip plane so that the electrical field excites all the E-probes simultaneously. Each probe feeds one of the four identical multiplying structures 106 on a same chip, so that the power-dividing/combining is performed directly on-chip 100. The produced output power can be recombined 107 at the output waveguide 108 using the same concept.

The multiplying structures 106 are physically embedded on a single chip 100 so the alignment and symmetry of the multiplying structures 106 can be very well preserved since that is controlled by the high accuracy of Monolithic Microwave Integrated Circuit (MMIC) lithography. Each of the integrated multiplying structures 106 are electrically identical and each of the multiplying structures include one input antenna (E-probe) 102 for receiving an input signal inputted on the chip 100, a stripline based input matching network 103 electrically connecting the input antennas to two or more Schottky diodes 105, two or more Schottky diodes that are used as nonlinear semiconductor devices to generate harmonics out of the input signal and produce the multiplied output signal, stripline based output matching networks for transmitting the output signal from the Schottky diodes to an output antenna 107, and an output antenna (E-probe) for transmitting the output signal off the chip into the output waveguide transmission line 108.

Contrarily to traditional frequency triplers, in this design the input waveguide 104 and output waveguide 108 are perpendicular to the waveguide channels 112 where the diodes are located. Therefore, the multiplier block can be more easily fabricated using Silicon micro-machining technology [5] instead of regular metal machining, especially at very high frequencies, beyond 1 THz, where the accuracy of traditional CNC metal milling is not enough to well define the small dimensions of the terahertz transmission waveguides.

The concept shown in FIG. 1(a) has been applied to the design of a high-power 1.6 THz tripler able to handle between 30-40 mW of input power with and expected efficiency of ~2-3% over a ~17% bandwidth, which is similar to that simulated for a equivalent single-chip tripler with a single balanced pair of Schottky diodes driven with four times less input power. The incident electrical field (TE 10 mode of propagation of the input waveguide) with E-field line direction 114a, propagating through the input waveguide 104 is coupled to the four identical E-probes 102 (antennas) symmetrically placed around the center of the waveguide 104, distributing the input power equally among the four identical multiplying structures 106 (featuring 2 Schottky diodes each). The output power can be recombined at the output 108 using the same concept: Two output E-probes couple the output signal from the chip to the output waveguide 108. Since there are four multiplying structures 106 (×4), two independent output waveguides 108a-b with one half of the total output power each are available, which can be recombined using a Y-junction 114b as well.

Also shown in FIG. 1(a) are the Direct Current (dc) feed lines 116 for biasing the Schottky diodes, and the electrical length 118 of the output waveguide necessary to obtain a single output, which is approximately 3.2 wavelengths of the output terahertz signal. Compared to a traditional quad-chip power-combined frequency tripler, 17 wavelengths electrical path 612 (see FIG. 6), this represents a reduction of around 5 times in the electrical path, and thereby, in the waveguide losses when the invention proposed herein is employed.

Figure 1B:
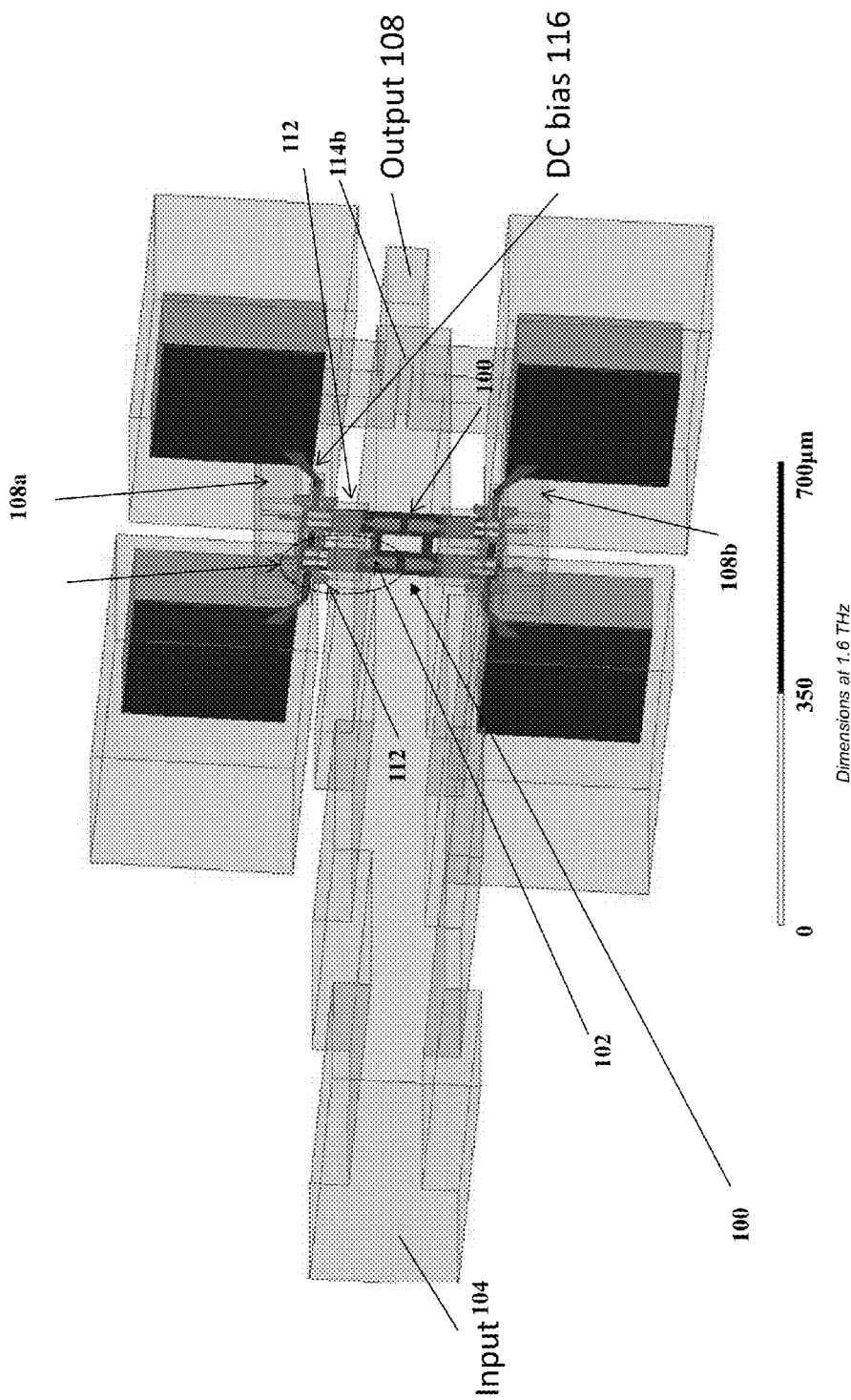
FIG. 1(b) illustrates an on chip power combining scheme and input and output waveguides for generating 1.6 THz using four on-chip multiplying structures and eight Schottky diodes total, according to one or more embodiments of the invention.

FIG. 1(b) illustrates another view of a 1.6 THz "on chip" power-combined frequency tripler combining four multiplying structures, recently demonstrated at the Jet Propulsion Laboratory (JPL) for high-frequency mixers and multipliers.

FIG. 1(c) illustrates another on chip power combining embodiment combining two multiplying structures and input 104 and output waveguides 108, for generating 1.9 THz using four Schottky diodes (two per multiplying structure), wherein the DC bias lines 116 are also shown. The longitudinal axis 120 of the input waveguide 104, and the direction 122 perpendicular to the longitudinal axis 120 are also shown. The top surface of the chip 100 contains the direction 122.

Figure 1D:
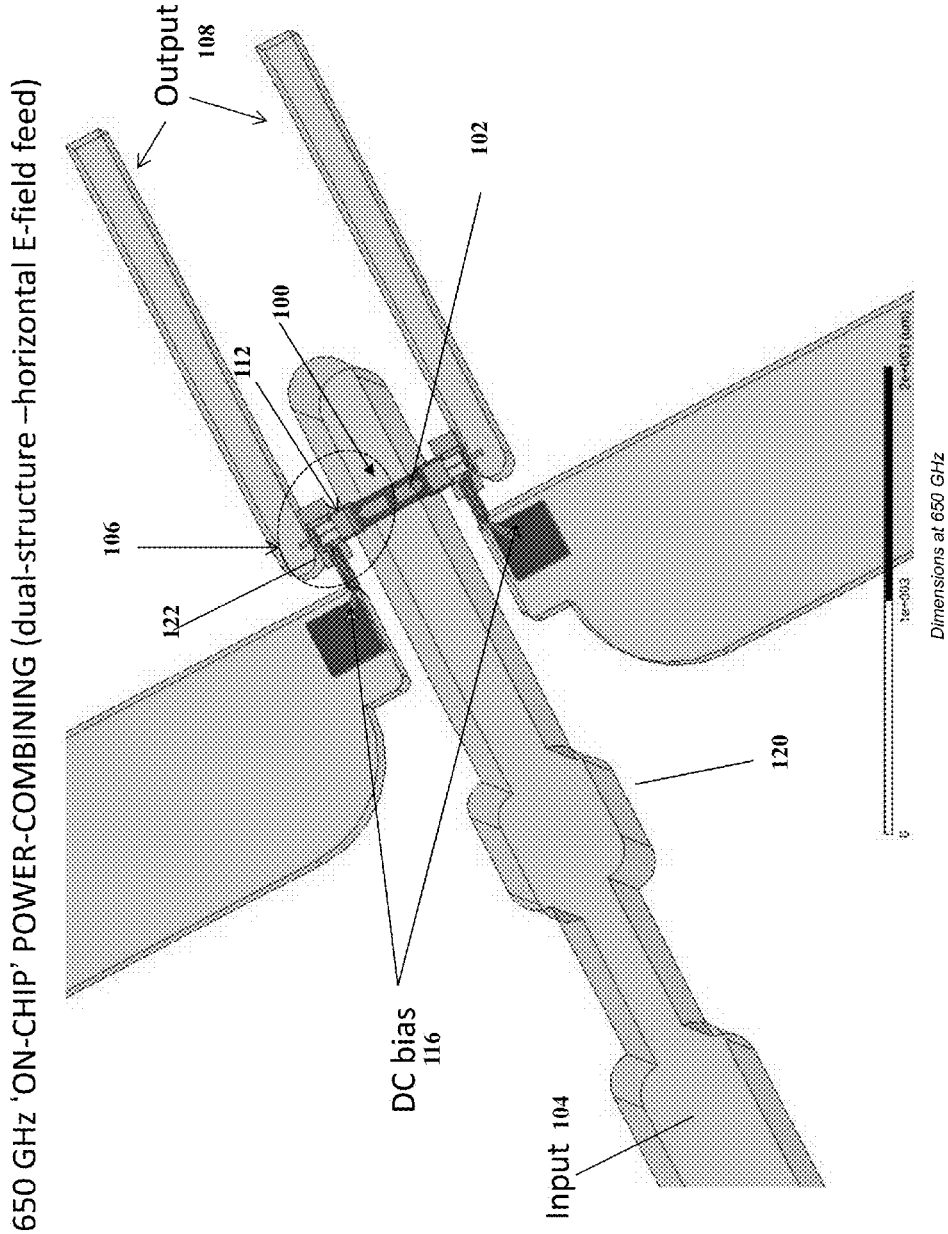
FIG. 1(d) illustrates an on chip power combining scheme and input and output waveguides for generating 650 GHz using two on-chip multiplying structures and four Schottky diodes total, according to one or more embodiments of the invention, wherein the E-field excitation to the chip is through and input waveguide along the same plane as the one where the chip is located.

FIG. 1(d) illustrates another on chip power combining embodiment combining two multiplying structures 106 and input 104 and output waveguides 108, for generating 650 GHz using four Schottky diodes (two per multiplying structure), wherein the DC bias lines 116 are also shown. In this case, the two multiplying structures are mirrored within a single axis. This makes it possible to use this on-chip power combining topology within traditional split-waveguide blocks without the necessity of multiple layer stacking using either thin metal plates or metal plated silicon wafers. In other words, the longitudinal axis of the input and output waveguides are within the plane of the chip instead of perpendicular to it.

Description of the On-Chip Power Combined Frequency Tripler Topology

Figure 2:
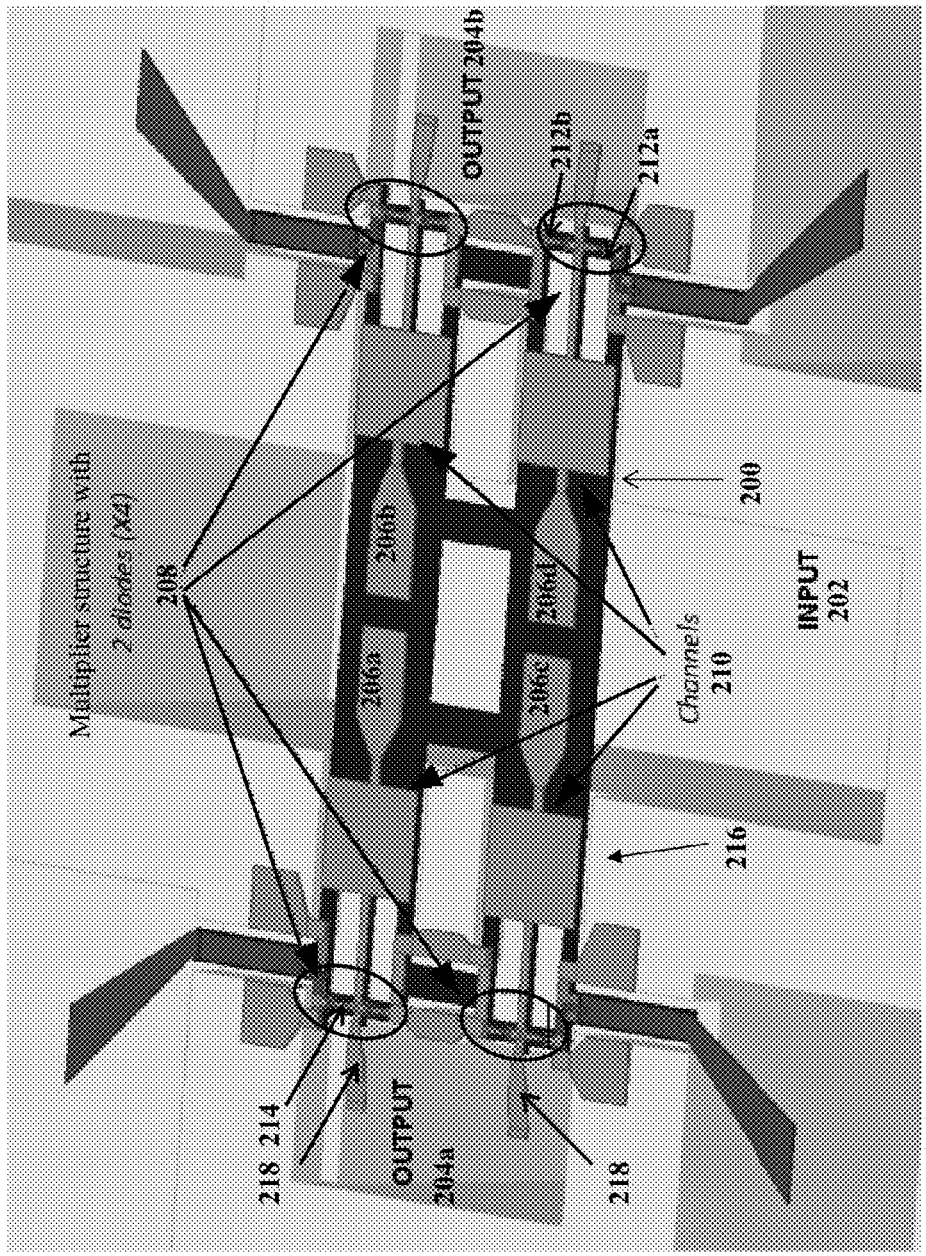
FIG. 2 is a close-up view of the on-chip power-combined MMIC device, according to one or more embodiments of the invention, wherein four dc beamleads provide independent bias to each diode branch, if fine tuning of the tripler performance is not required, only a single bias line would be necessary; and four input E-probes or antennas divide the input power evenly among the four multiplying structures.

FIG. 2 illustrates how, based on the frequency multiplier topology described in [1,6], the present invention's novel concept exploits the three dimensional (3D) capabilities of the Silicon micromachining in order to place the MMIC multiplier chip 200 perpendicular to the E-plane of both the input waveguide 202 and output waveguide 204. With this strategy, four identical E-probes 206a-d can be used in-phase with the electric field lines of the exciting TE mode to equally divide the input signal into four ways directly on-chip 200. It is important to remark that for low frequencies of operation within the submillimeter-range, very thin metal plates instead of silicon may be used to obtain the 3D stack. The advantage of using silicon is that Silicon layers thinner than 1 mm can be used (3 mm is the minimum for metal plates using CNC milling). Moreover, with silicon micromachining, the waveguide structures are formed using (deep reactive ion-etching) DRIE techniques, much more precise (better than 1 μm) than CNC milling (~5-10 μm accuracy).

The same concept is applied to recombine the power at the output. Two output E-probes or antenna feed each of the two output waveguides 218. This prevents the need of using waveguide-based power dividing structures that would add undesired excess losses to the circuit. In addition, the balance and symmetry of the circuit with this new approach, which is crucial to obtain a good performance in any power-combined frequency multiplier at terahertz frequencies [4,7], lies on the superior accuracy of the lithographic fabrication of the MMIC chip and Silicon micro-machined blocks (<1 micrometer (μm)) rather than on the tolerances involved with manual assembly of a number of independent chips (see FIG. 6) and traditional metal milling (5-10 μm). This could represent a big step for future multipliers operating beyond 1 THz where dimensions of critical elements of the device can be as low as 10-20 μm between 1-2 THz, and 5-10 μm beyond 2 THz.

Note that this topology inherently provides two independent outputs 204a-b that can be either combined together using a Y-junction, as shown in FIG. 1(a), or used to feed two independent frequency mixers in order to enable direct multi-pixel operation.

On-Chip Power Combined Multiplier Design

The complete power-combined multipliers are designed using the software and iterative methodology presented in detail in [1] for a traditional single-chip Schottky diode based frequency multiplier. This iterative process involves the use of Ansoft HFSS or similar for the electromagnetic simulation of the multiplier architecture and Agilent ADS or similar for nonlinear simulation of the Schottky diode device and the harmonic balance optimization of the matching circuitry.

Once the input power has been split at the input probe 206a-d level, the topology in FIG. 2 can be seen as four identical frequency triplers 208 located at four independent small waveguide channels 210 between the input waveguide 202 and output waveguides 204a-b. Each of these multiplying structures 208 features two or more Schottky planar varactor diodes 212a-b and has several stripline sections 214 of low and high impedance used to match the diodes at the input and output frequencies and to prevent the third harmonic from leaking into the input waveguide 202. In order to balance each multiplying structure 216, the dimensions of both the channel 210 and the circuit 216 are chosen to cut off the TE-mode at the second (idler) frequency. The dimensions of the output waveguide 204a-b ensure that the first and second harmonics are cut off at the output, and the balanced configuration of the diodes 212a-b ensures that the power levels from all the even harmonics of the input signal are strongly suppressed. The design is completed with a series of waveguide sections to provide broadband input matching to the diodes.

Figure 3A:
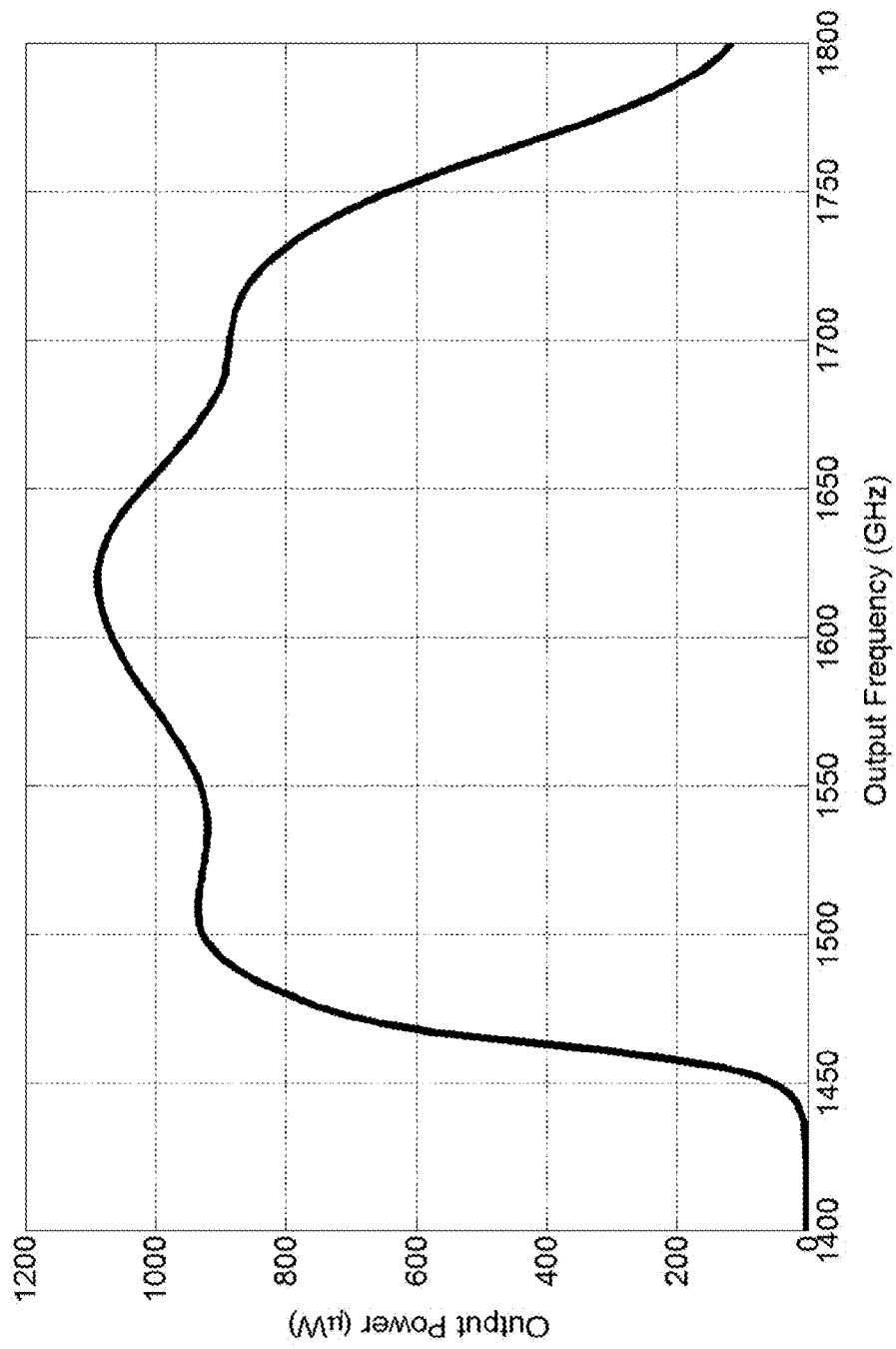
FIG. 3(a) is a predicted performance of the on-chip power combined 1.6 THz frequency tripler for an input power of 32 mW, according to one or more embodiments of the invention.
Figure 3B:
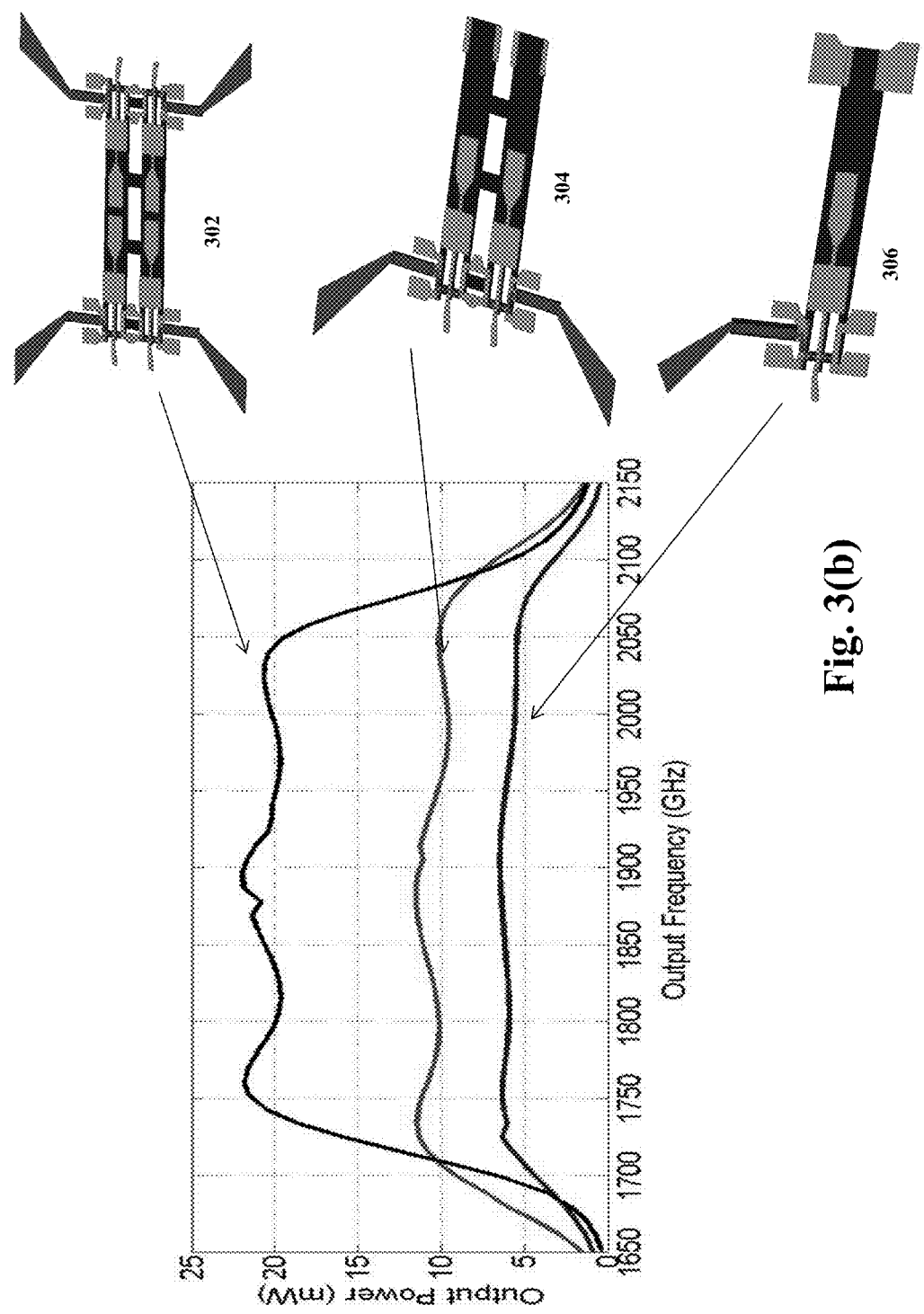
FIG. 3(b) is a predicted performance of the on-chip power combined 1.9 THz frequency tripler (single configuration, dual configuration and quad configuration) for an input power of 1, 2 and 4 mW respectively, according to one or more embodiments of the invention.
Figure 3C:
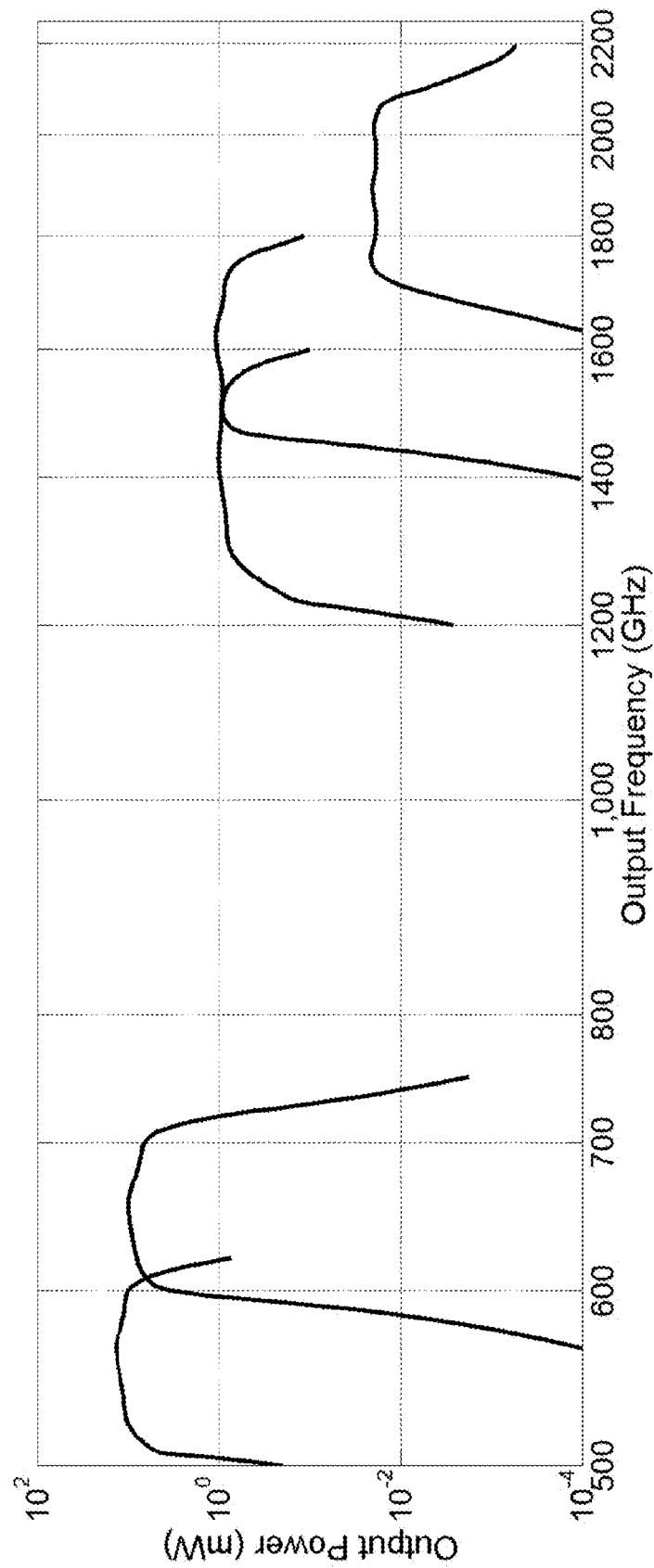
FIG. 3(c) is a predicted performance of the on-chip power combined 550 GHz, 650 GHz and 1900 GHz frequency triplers, according to one or more embodiments of the invention.
Figure 4A:
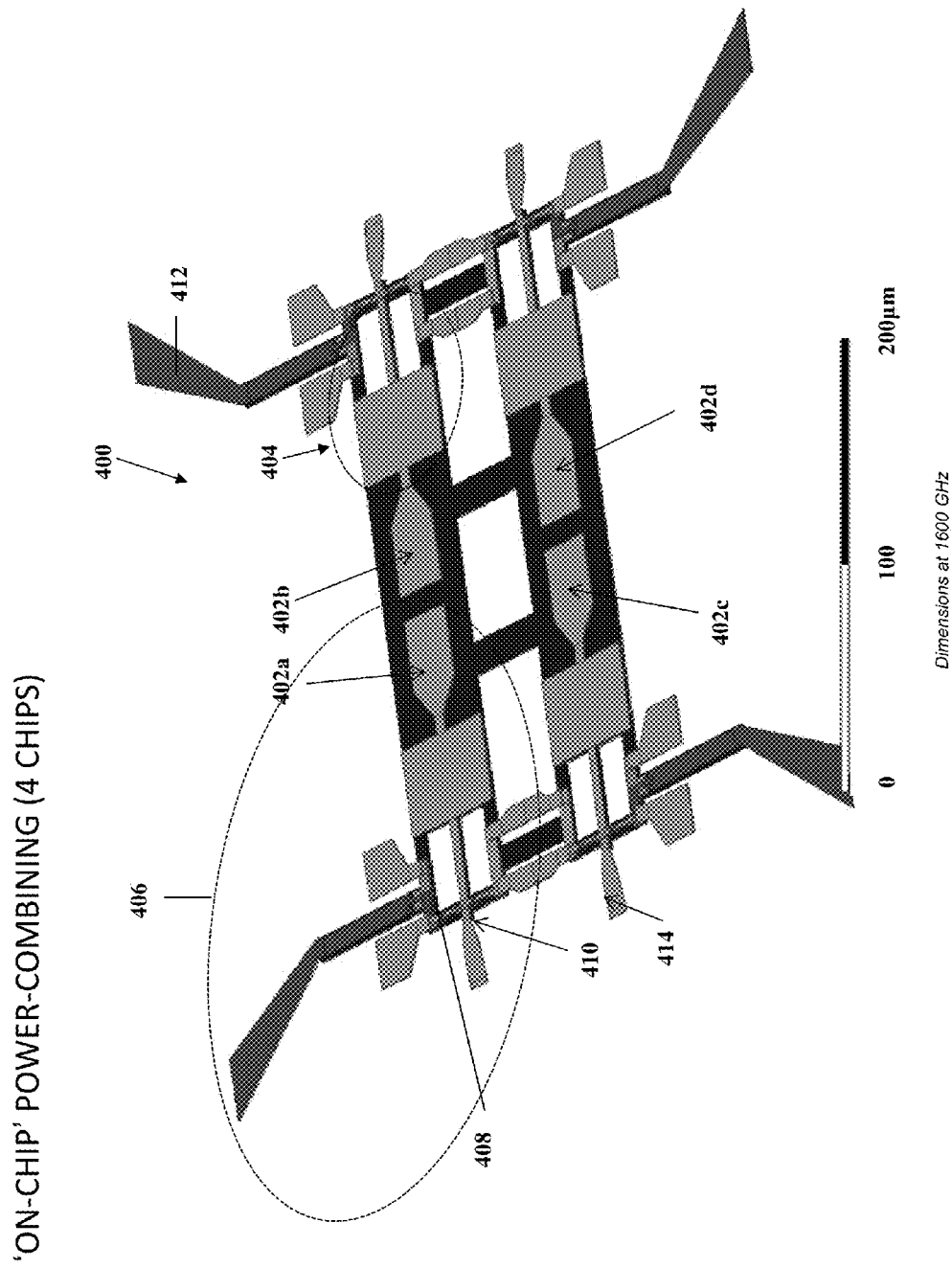
FIG. 4(a) illustrates a close up view of an on chip power combining scheme for generating 1.6 THz using eight Schottky diodes (or four balanced pairs of Schottky diodes), according to one or more embodiments of the invention.

The predicted performance of the on-chip power combined 1.6 THz frequency tripler of FIG. 1(a), for a 32 mW input power, is presented in FIG. 3a. A conversion efficiency of 2-3% is expected over a ~20% bandwidth. The output power of a design at 1.9 THz is presented in FIG. 3(b) for three different configurations: single 306, dual 304 and quad-structure 302, wherein the claimed increase in output power proportional to the number of multiplying structures within the chip is shown. In FIG. 3(c), the performance of quad on-chip power combined triplers at different frequencies are shown to demonstrate that the concept can be used at any operation frequency, FIG. 4(a) shows a close-view of the 'on-chip' power-combined frequency multiplier chip 400 (featuring four multiplying structures 406) already illustrated in FIG. 1(a) including four input antennas or E-probes 402a-d that evenly split by a factor of 4 the input power inputted through the TE10 mode of an input waveguide transmission line. The input electric field can be at any frequency bandwidth within the millimeter, submillimeter-wave and terahertz range. The antennas are electrically connected to the diodes by means of an input matching network 404 formed by stripline transmission lines (of high and low impedance) that guarantee that almost all the inputted power is transmitted to the diodes as well as guarantee that the third harmonic is not transferred back to the input. The antennas and input/output matching networks can be formed including one or more materials (generally a semiconductor substrate to support the striplines, and metals for the striplines).

Each of the Schottky diodes 408 receives one of the portions of the input power from the transmission lines 404. Each of the Schottky diodes 408 then frequency multiplies the input frequency to generate the frequency multiplied output signal. The balance configuration of the diodes and the waveguide channel where the diodes are located guarantee that only the desired multiplication product of the input signal is transferred to the output. The Schottky diodes 408 are disposed in balanced pairs that suppress power from all even harmonics of the W-band electric field (for the case of a frequency tripler).

An output matching stripline 410 electrically connects the Schottky diodes 408 with the output antennas or E-probes 414 that transmit the frequency multiplied signal out of the chip into the output waveguide.

Also shown are DC bias lines 412 for the Schottky diodes 408.

Figure 4B:
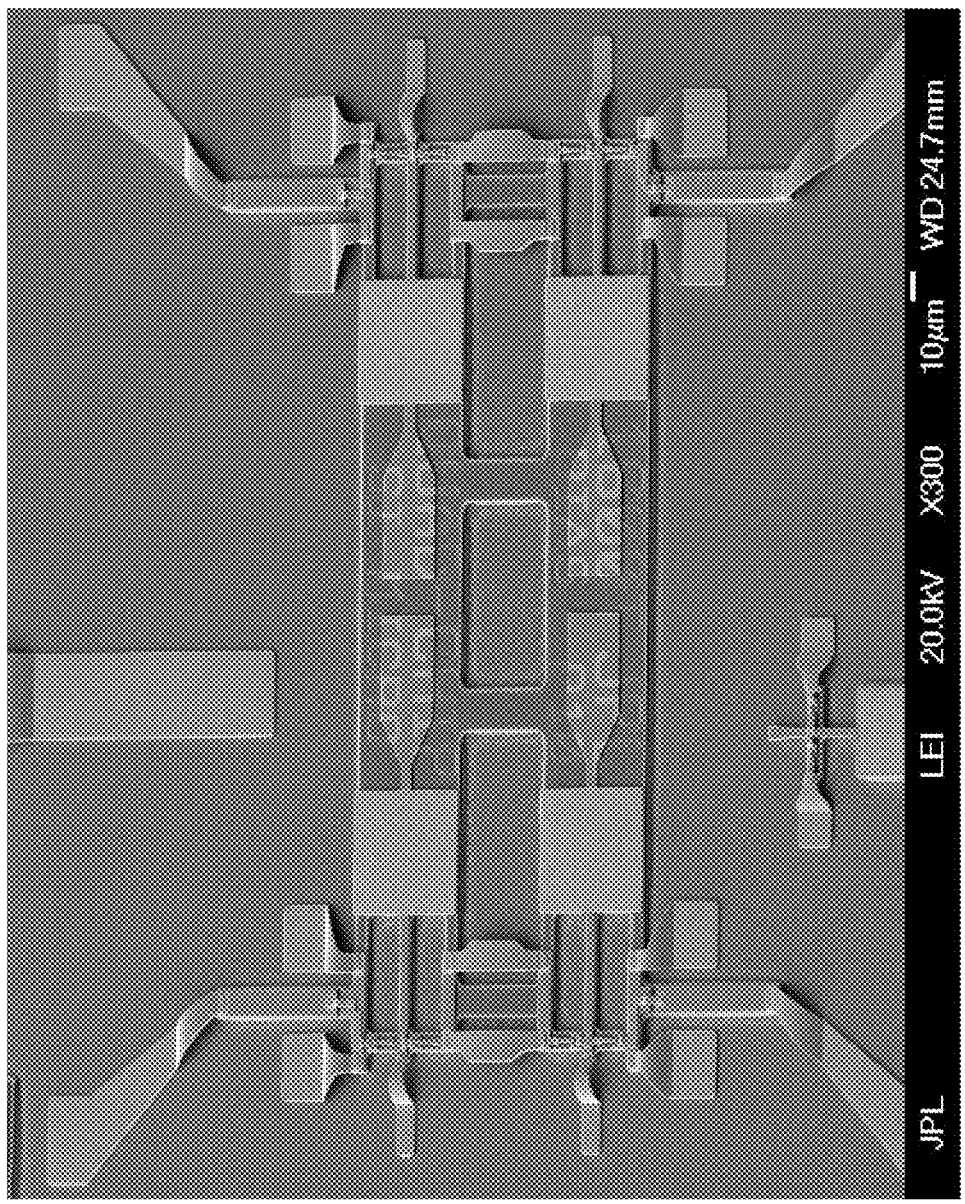
FIG. 4(b) is a Scanning Electron Microscope (SEM) image of the scheme illustrated in FIG. 4(a), according to one or more embodiments of the invention.

FIG. 4(b) is an SEM image of the scheme illustrated in FIG. 4(a).

Figure 5A:
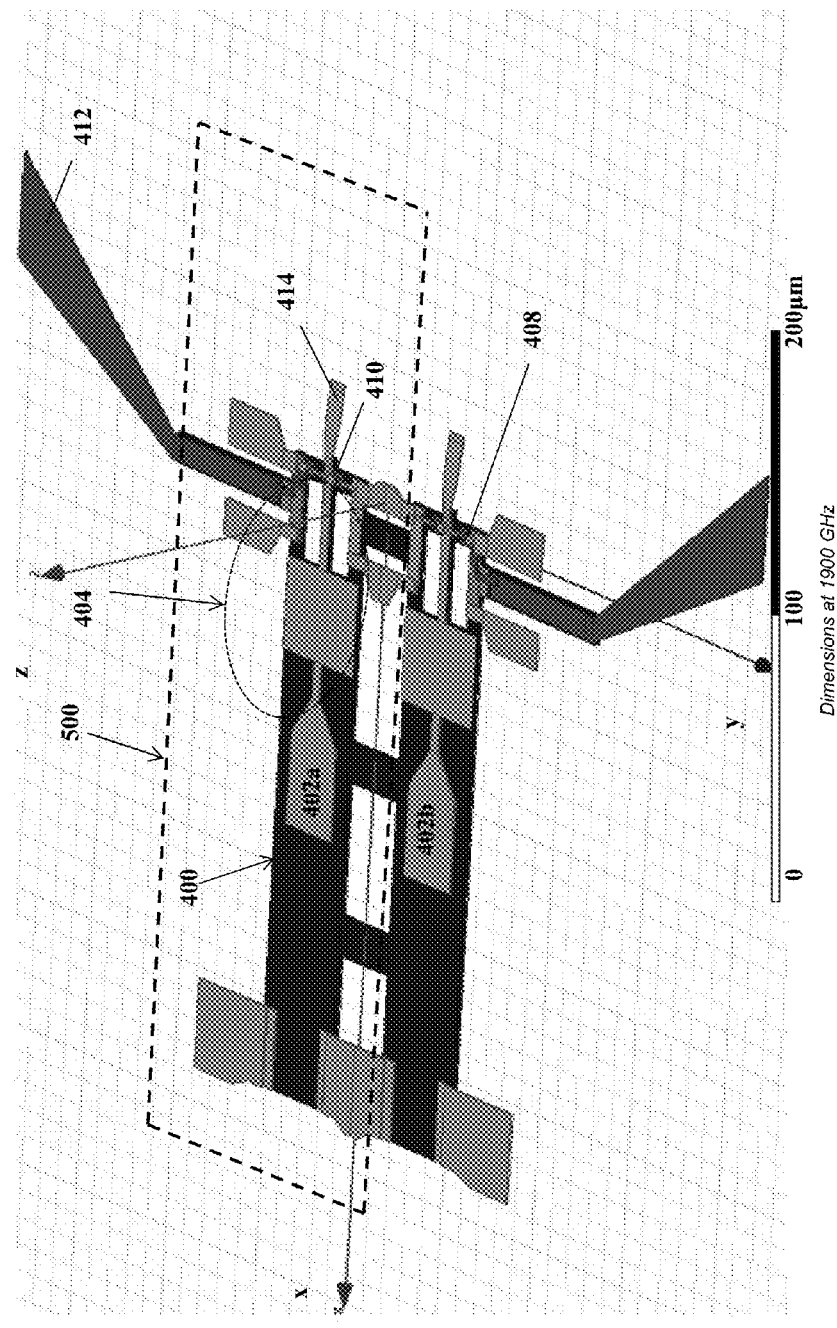
FIG. 5(a) illustrates a close up view of an on chip power combining scheme for generating 1.9 THz using four Schottky diodes (or two balanced pairs of Schottky diodes), according to one or more embodiments of the invention.

FIG. 5(a) illustrates a close up view of an on chip power combining scheme for generating 1.9 THz using two multiplying structures instead of four, according to one or more embodiments of the invention. In FIG. 5, orthogonal x, y and z coordinate axes are also shown.

Figure 5B:
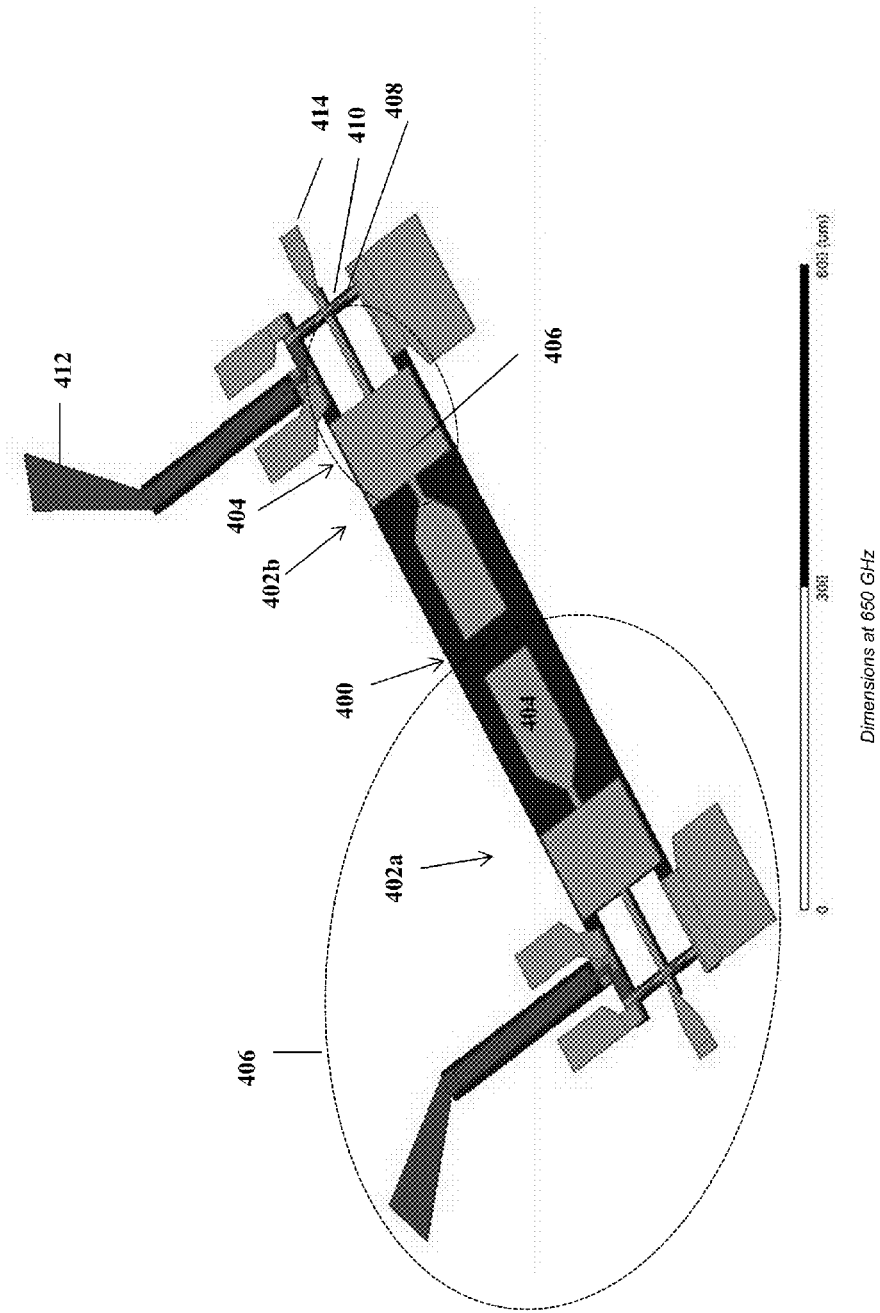
FIG. 5(b) illustrates a close up view of an on chip power combining scheme for generating 650 GHz using four Schottky diodes (or two balanced pairs of Schottky diodes), according to one or more embodiments of the invention.

FIG. 5(b) illustrates a variation of the 'on-chip' power-combining multiplier chip with the two multiplying structures 406 mirrored along a single axis. With this configuration, the input antennas can be excited with both an input waveguide perpendicular to the chip plane, or an input waveguide with its longitudinal axis in the same plane as the chip plane. This make it compatible with traditional split waveguide multipliers blocks fabricated using standard CNC milling.

Figure 5C:
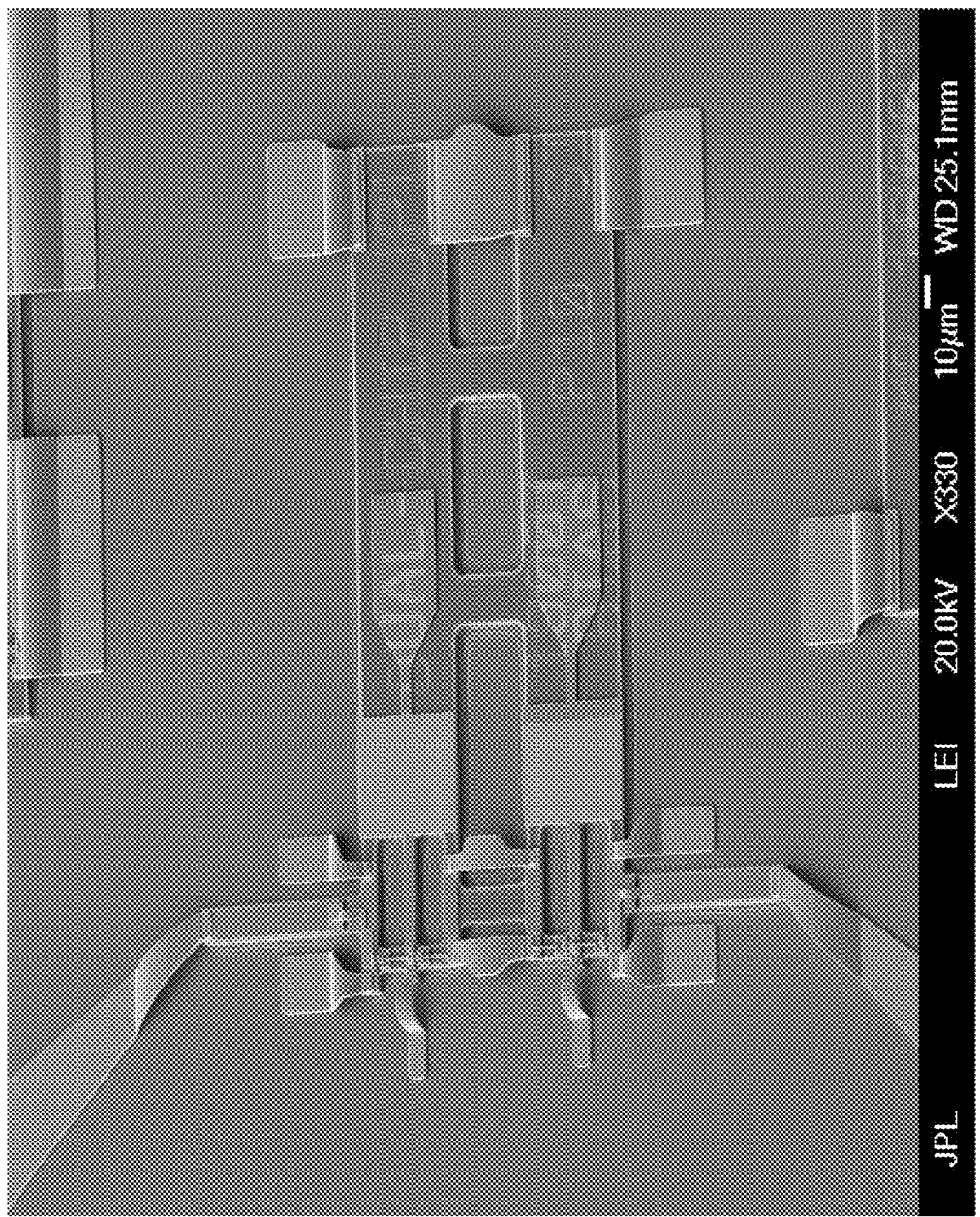
FIG. 5(c) is an SEM image of the scheme illustrated in FIG. 5(a), according to one or more embodiments of the invention.

FIG. 5(c) is an SEM image of the scheme illustrated in FIG. 5(a).

Figure 6:
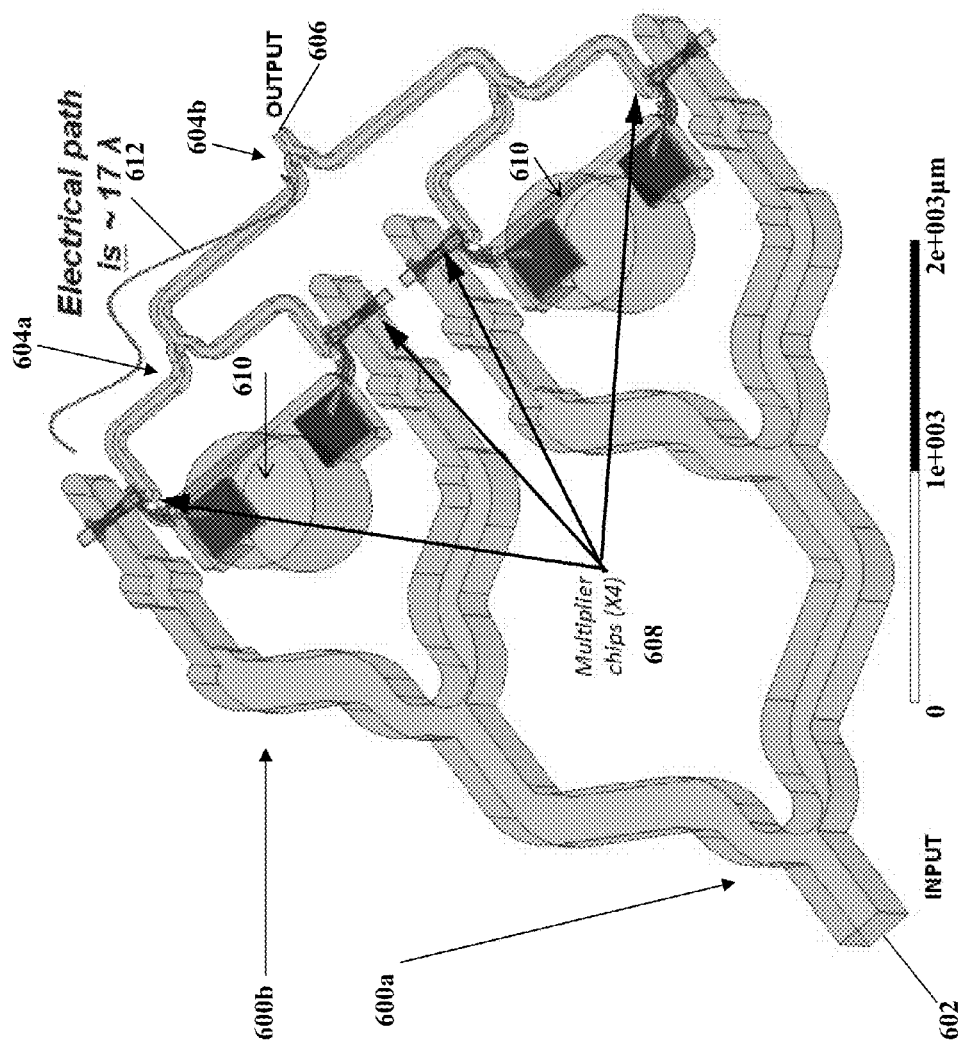
FIG. 6 is a quad-chip power-combined 1.6 THz Schottky diode tripler using traditional power-combined techniques based on Y-junctions.

Comparison Between On-Chip Power Combining and Traditional Quad-Chip Power Combining In order to evaluate the advantages of the proposed multiplier scheme over other power-combining techniques, an equivalent quad-chip frequency tripler has been designed following the same specifications and identical number of diodes an anode sizes, as shown in FIG. 6.

FIG. 6 shows that in this case, two levels of Y-junctions 600a-b at the input waveguide 602, and two levels of Y-junctions 604a-b at the output waveguide 606 have been employed to divide/combine the input/output signals. The scheme is similar to that proposed in [7]. The main constraints for this quad-chip 608 design is the high waveguide losses due to a large electrical length necessary to split/combine the power, and the necessity to use at least two dc bias feed throughs 610 so that the bias connector can be place in the top of the metal block. This sets a minimum distance between the multiplier chips 608 and leads to an undesired increase in the electrical path 612 of the output signal (17 wavelengths λ of the output signal), as can be seen in FIG. 6.

However, for the on-chip power-combined topology of one or more embodiments of the present invention, the complexity of the bias circuitry is greatly reduced since it can be placed on a plane perpendicular to the input and output waveguides. The electrical path of the output signal 118 is then around 3λ (see FIG. 1), which implies a reduction of more than a factor of 5 in the output waveguide losses.

Figure 7:
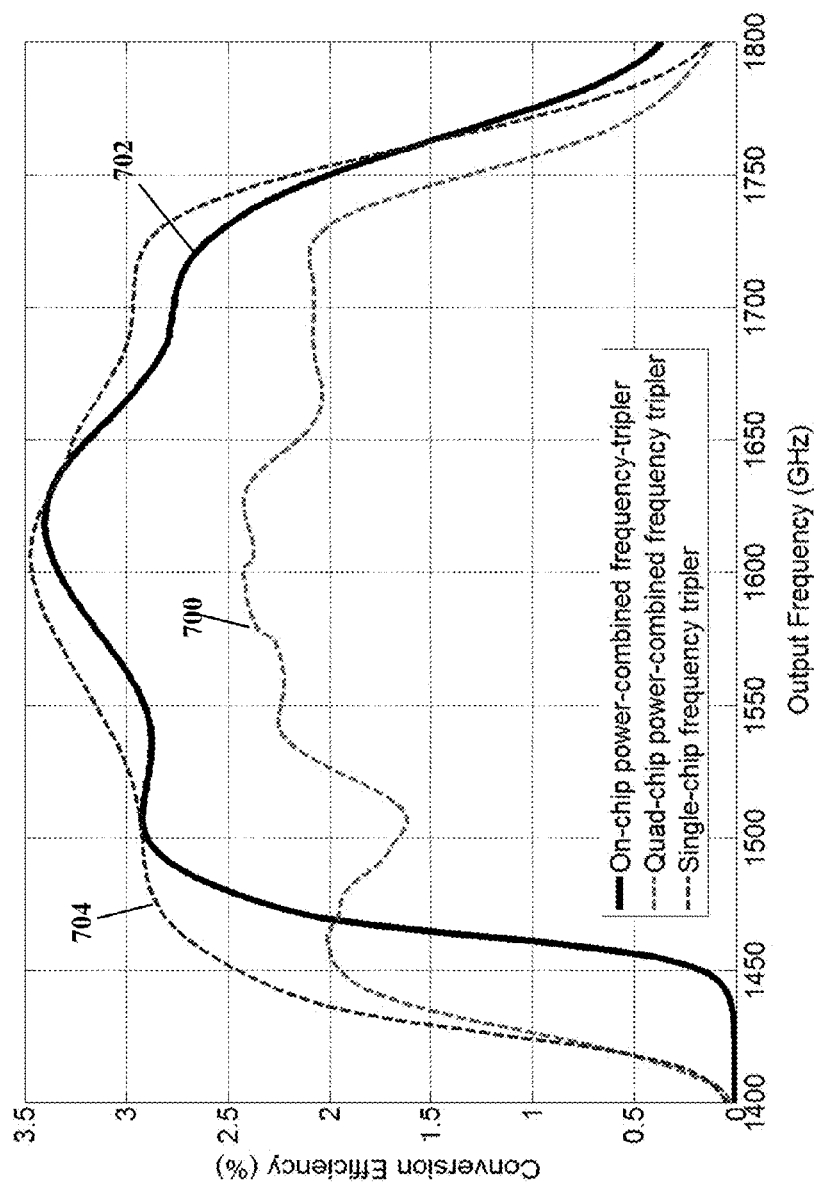
FIG. 7 is a conversion efficiency of a single-chip 1.6 THz frequency tripler a quad-chip power combined 1.6 THz frequency tripler using the traditional power-combining techniques, illustrated in FIG. 6, and an on-chip power-combined 1.6 THz Schottky diode tripler (FIG. 1(b)) according to one or more embodiments of the invention.

The comparison between the two architectures is plotted in FIG. 7, together with the simulated performance of a single-chip 1.6 THz tripler designed for 8 mW (one fourth of the input power of the power-combined multiplier). This single chip corresponds to one of the branches or chips 608 shown in FIG. 6. FIG. 7 clearly shows the degradation in the conversion efficiency of the quad-chip tripler based on traditional power-combined schemes 700, mainly due to the waveguide losses connected with the necessity of using a number of Y-junctions 600a-b, 604a-604b to power-combine the input and output signals (dashed line 700). However, the on-chip power-combined tripler (black solid line 702) exhibits an efficiency very close to the single-chip multiplier design (dashed curve 704), which would set the reference for an ideal power-combined multiplier. Only the bandwidth is slightly reduced due to the fact of having kept the same dimensions for the reduced-height input waveguide in all the three cases, which made it necessary to reduce the lengths of the four E-probes so they could still fit together within the input waveguide. A better optimization of both the E-probes and the input waveguide dimensions in the on-chip power combined tripler would allow recovering the lost bandwidth with regards to the single-chip tripler.

The novel on-chip power-combining topology for high-frequency multiplier design combining four multiplying structures on a single chip allows the power handling capabilities of traditional frequency multipliers to be increased by a factor of four. As illustrated, one advantage of this approach with regard to other power-combining techniques involving multiple chips is that additional losses or performance degradation due to circuit imbalances are avoided. While embodiments of the topology are mainly presented through the design of a 1.6 THz and a 1.9 THz frequency tripler, for a nominal input power of 32 mW and 4 mW respectively, variations and modifications are possible (e.g. other output frequencies, combination of more or less chips, etc.).

Silicon-Micromachined Block Design

Figure 8:
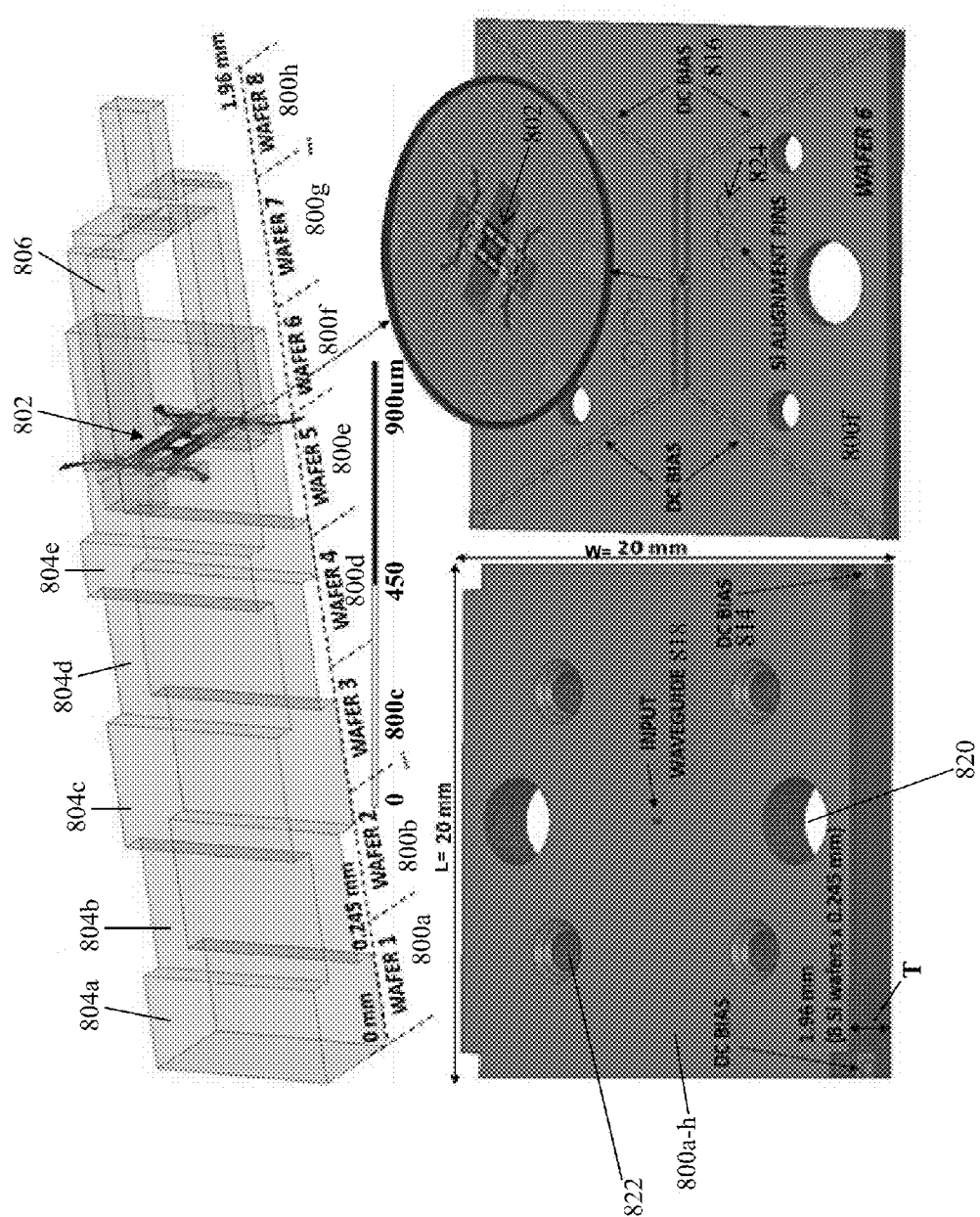
FIG. 8 is a final scheme of an on-chip power combined 1.6 THz Schottky tripler, including the input matching and output Y-junction to combine the two inherent outputs together (top), according to one or more embodiments of the invention, wherein the block design for Silicon micromachining features eight 0.245 mm-thick Silicon wafers (bottom left), a detailed view of the Silicon wafer where the chip(s) are located is also illustrated (bottom right), and the full block dimensions are 20×20×1.96 mm.

As discussed above, the block design of one or more embodiments of the present invention is based on the three dimensional (3D) integration of Silicon (Si) micromachined waveguide circuits (which might be replaced for very thin metal plates, around 3 mm-thick for low frequencies within the submillimeter-wave range). This extra degree of symmetry is necessary, which allows placement of the input waveguide 104 and output waveguide 108 perpendicular to the small waveguide channel 112 where the diodes are located (FIG. 1a). FIG. 8 illustrates this concept similar to traditional split-waveguide block designs, but wherein a number of very thin Silicon wafers 800a-h are stuck together in order to define both the waveguide channels 802, were the diodes are located, and the input 804a-e and output 806 matching sections.

In the embodiment of FIG. 8, up to eight 245 micrometers (μm)-thick Silicon wafers 800a-h need to be employed to fit the matching sections 804a-e, the waveguide channel 802 where the chip is placed, and the Y-junction 806 to recombine the signal at the output. The number and thickness of the required wafers depends on the necessary bandwidth of the design, the operation frequency and the topology of the waveguide matching sections. Wafer to wafer alignment is performed using Silicon (Si) alignment pins 824 of diameters between 0.5 and 1 mm. The total thickness T of the block is 1.96 mm or less (for the 1.6 THz frequency tripler), which represents a reduction of 5-10 times with regards to the metal block dimensions that would be necessary for a traditional split-waveguide metal block design, like the structure presented in FIG. 6. Also shown are DC bias pads 814 and DC bias lines 816, and input waveguide 818. Flange holes for standard UTC flanges including metal alignment pin holes 822 and screw holes 820 are shown as well.

Process Steps

FIG. 9(a)-(h) illustrate a method of fabricating a device comprising an integrated circuit, according to one or more embodiments of the invention (referring also to FIG. 1, FIG. 2, FIG. 4(a) and FIG. 8).

Block 900 and FIG. 9(b) represent lithographically patterning of the Schottky diode mesa 900a and ohmic contact 900b formation out of a Gallium Arsenide wafer 900c. The Schottky diode can comprise n-GaAs 900d, n+GaAs 900e formed on a Si-GaAs substrate 900f. Also shown are AlGaAs layers 900g.

Block 902 and FIG. 9(c) represent the deposition of the Schottky anodes or Schottky contacts 902a using electron beam lithography (e-beam), and the deposition of the metal interconnection lines 902b that connect the Schottky diodes with the input and output matching network and form the stripline matching sections and input and output antennas themselves (402, 404 and 408).

Block 904 and FIG. 9(d) illustrate the formation of the bridge metals 904a that electrically connect the diodes with the interconnection metal that forms the rest of the multiplier circuit. It also illustrates the passivation process using silicon nitride 904b to protect the circuit metal lines.

Block 906 shows the membrane layer etch from the original wafer thickness down to the thickness required for the submillimeter-wave circuit, usually 2-50 μm. Metal air-bridges 906a for the dc bias line and the ground (gnd) connections are deposited at this point as well, as shown in FIG. 9(e).

Blocks 908 and 910 represents the removal of the unnecessary parts of the GaAs substrate so that the complete chip can be released. During this step, the chip can be attached to a carrier wafer (e.g., sapphire 908a) using wax 908b and the substrate can be removed using an AlGaAs etch stop layer 900g, as shown in FIG. 9(f), and the chip/device can then be removed from the carrier wafer as shown in FIG. 9(g). FIG. 9(g) also illustrates formation of an RF probe 910a.

Block 912 and FIG. 9(h) represent the installation and fastening of the device within the mechanical block (inside the waveguide channel machined specifically for this goal (see 206 in FIG. 2)).

Steps can be added, or omitted, or performed in a different order, as desired.

Figure 9:
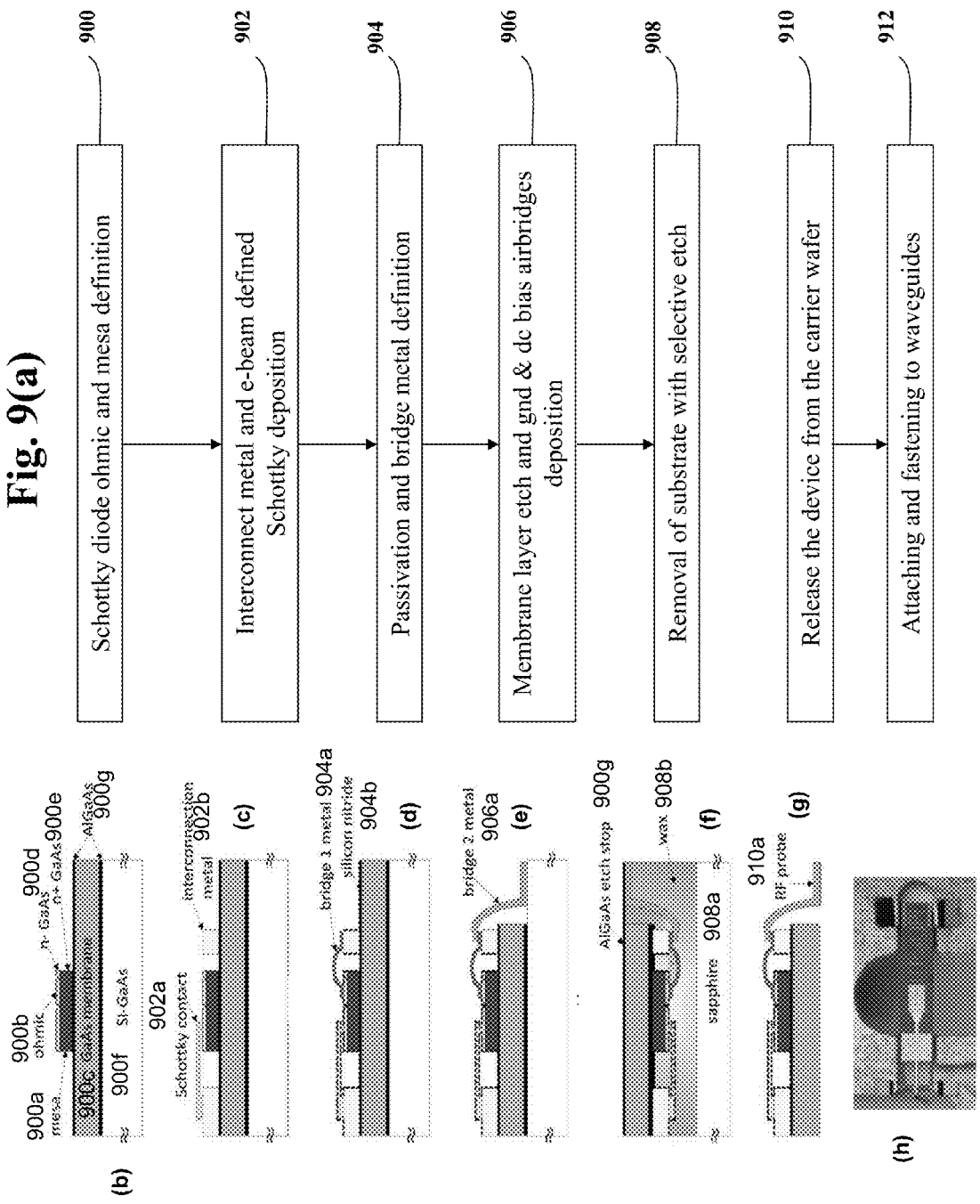
FIG. 9(a)-(h) is a flow chart and schematics illustrating a method of fabricating a Schottky diode based frequency multiplier device including an integrated circuit, according to one or more embodiments of the present invention.

Accordingly, FIG. 9 illustrates a method for fabricating an integrated circuit, comprising: Schottky diode ohmic and mesa definition (Block 900), forming of the interconnect metal (Block 902) (input/output matching striplines sections, input and output probes, etc.) and e-beam defined Schottky deposition, passivation and bridge metal definition (Block 904), membrane layer etch and ground & dc bias airbridges deposition (Block 906), removal of substrate with selective etch (Block 908), release the chip from the carrier wafer (Block 910) and assembly of the chip into the plated silicon-wafer based housing or metal thin plates-based housing (Block 912).

The Schottky diodes can be connected to the interconnection metal by means of metal airbridges.

Direct current (DC) bias lines using beamleads can be disposed in Block 906 to bias each of the Schottky diodes 408. The integrated circuit dc bias lines can be connected to external bias lines that can be formed directly on the silicon wafer that includes the waveguide channel where the chip is located or otherwise using wire-bonded capacitors placed on a small waveguide channel.

The integrated circuit 400 of one or more embodiments of the present invention (see FIG. 1(a)-(c), FIG. 2, FIG. 4(a), FIG. 5) can comprise repeated instances of the circuitry on the chip 608 of FIG. 6. The rectangle 500 illustrated in FIG. 5(a) encloses the circuitry found on the chip 608. Accordingly, the integrated circuit 400 can contain, on a single chip, more than one instance of the circuitry enclosed by the rectangle 500. For example, FIG. 4(a) illustrates an embodiment of a chip 400 with four instances/repeats of the circuitry in the rectangle 500, and FIGS. 5 and 5(*b*) illustrates an embodiment of a chip with two instances/repeats of the circuitry in the rectangle 500.

The method of FIG. 9 can be used to fabricate a novel MMIC on-chip power-combined frequency multiplier device, comprising two or more multiplying structures 406 integrated on a single chip 400, wherein each of the integrated multiplying structures are electrically identical and each of the multiplying structures 406 include one input antenna (or E-probe 402*a*) for receiving an input signal in the millimeter-wave, submillimeter-wave or terahertz frequency range inputted on the chip, a stripline based input matching network 404 electrically connecting the input antennas to two or more Schottky diodes 408 in a balanced configuration, two or more Schottky diodes 408 that are used as nonlinear semiconductor devices to generate harmonics out of the input signal and produce the multiplied output signal, stripline based output matching networks 410 for transmitting the output signal from the Schottky diodes 408 to an output antenna 414, and an output antenna (E-probe 414) for transmitting the output signal off the chip 400 into the output waveguide transmission line 800*g-h*.

A novelty of one or more embodiments of the invention is that the power-combining is performed directly on chip 400 contrarily to the traditional power-combining schemes. The two or more input antennas or E-probes 402*a* divide the input signal equally among the multiplying structures 406 within the chip 400 and re-combine it at the output 204*a-b* using the same concept. An improvement in power-handling capabilities and output power of a factor equal to the number of multiplying structures 406 included in the chip 400 can be achieved.

The circuit can have a pattern that is symmetric about at least two axes passing through a central point of the circuit.

FIG. 9 also shows the integrated circuit comprising the millimeter-wave, submillimeter-wave or terahertz stripline antennas 402*a*, 414, transmission lines 404, 410, and semiconductor device (for example, Schottky diodes 408 are typical for frequency multipliers) can be lithographically patterned on a semi-insulating semiconductor substrate 900*f* (typically 2-50 um-thick GaAs) and deposited on a plated silicon-wafer based housing or a metal-plated block, as shown in FIG. 8.

The integrated circuit fabricated using the method of FIG. 9 can include at least one pair of balanced Schottky diodes 408 per multiplying structure 406, i.e. at least two pairs for a dual on-chip multiplier configuration and at least four pairs for a quad on-chip multiplier configuration. The diodes 408 are typically nonlinear semiconductor devices that generate harmonic of the input signal so that the input signal is multiplied up in frequency.

Figure 10:
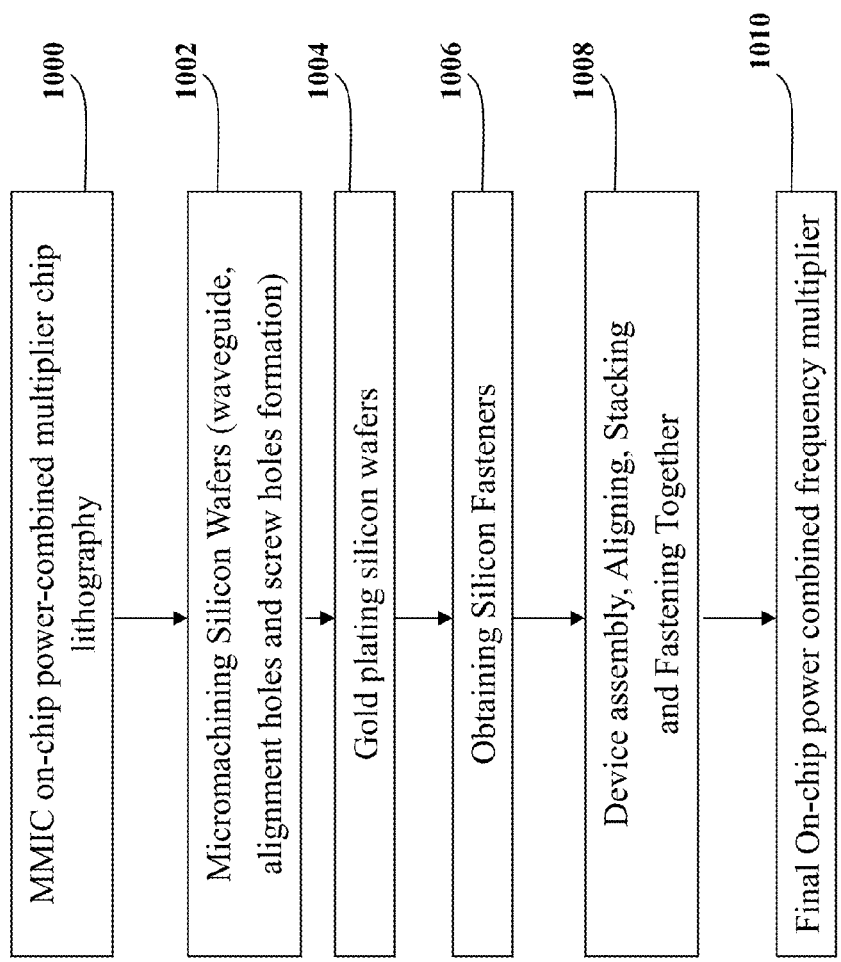
FIG. 10 illustrates a method of fabricating a frequency multiplier device on a silicon micromachined waveguide block, according to one or more embodiments of the invention.

FIG. 10 illustrates a method of fabricating a frequency multiplier device, according to one or more embodiments of the invention (referring also to FIG. 1, FIG. 2, FIG. 4(*a*) and FIG. 8).

The method can comprise the following steps.

Block 1000 represents micro-machining, using deep reactive ion etching (DRIE), of a plurality of silicon wafers 800*a-e*, wherein the input silicon wafers aligned, stacked, and fastened together form the input and output waveguide matching circuits as well as the waveguide channel where the chip is placed (e.g., the input waveguide 104, 202, FIG. 1(*a*), FIG. 4(*a*))). Micro-machining can include machining dimensions of 10 micrometers or less, for example. The step further includes MMIC on chip power combined multiplier chip lithography.

Block 1002 represents micro-machining a plurality of output silicon or semiconductor wafers 800*g-h*, wherein the output silicon wafers aligned with the multiplier chip, stacked, and fastened together form the frequency multiplier circuit. The dimensions of the output waveguides can ensure that first and second harmonics of the input W-band frequencies are cut off at an output from the output waveguides. Micro-machining can include machining dimensions down to 10 micrometers or less, for example.

One or more dimensions of each input silicon wafer 800*a-e* can be machined wherein each input silicon wafer 800*a-e* is dimensioned to be impedance matched to the on-chip power-combined frequency multiplier integrated chip 400 at the frequency bandwidth of operation. One or more dimensions of each output silicon wafer 800*g-h* can be machined wherein each output silicon wafer is impedance matched to the on-chip power-combined frequency multiplier integrated chip 400 at the frequency bandwidth of operation.

Blocks 1000 and 1002 can further include micromachining/formation of waveguide alignment holes and screw holes.

Block 1004 represents the gold metal plating or gold metal sputtering of the silicon wafers.

Block 1006 represents obtaining/fabricating one or more machined silicon fasteners 812, wherein the silicon wafers 800*a-h* are fastened together by insertion of the micromachined silicon fasteners 812 into the fastening holes 824 in each of the input silicon wafers 800*a-f*.

Block 1008 represents aligning, stacking, and fastening together the micro-machined input silicon wafers 800*a-h*, wherein the integrated circuit 400 is between the input silicon wafers 800*a-e* and the output silicon wafers 800*g-h*, the input waveguide 202 inputs a millimeter-wave, submillimeter-wave or terahertz electric field on the Schottky diode based frequency multiplier chip 400.

Block 1010 represents the circuit once completed using the above steps (e.g., as illustrated in FIG. 8). Moreover, embodiments of the present invention can include the input/output circuit components 400 designed for frequencies other than millimeter-, submillimeter waves and terahertz signals, frequency multiplying semiconductor devices 208 other than Schottky diodes 408. In addition, the present invention is not limited to particular electric field. Any input electromagnetic field/radiation can be used, for example.

Steps can be added, or omitted, or performed in a different order, as desired.

Embodiments of the present invention enable the fabrication of waveguides consisting essentially of silicon or semiconductor (e.g., using silicon where metal was conventionally used).

The steps of Blocks 1000-1002 can comprise micro-machining a plurality of silicon wafers (800*a-h*, or metal thin plates, including the input 804*a-e* and output 806 waveguide matching networks as well as the waveguide channel 802 where the chip is placed. The silicon wafers 800*a-h* (or metal thin plates) can be aligned, stacked, and fastened together using alignment pins 824, screw holes or any other alignment technique, as illustrated in Block 1008.

The method can further include, as represented in Blocks 1000-1002, machining one or more fastening holes 824 in each of the silicon 800*a-h* or metal wafers; machining mount holes for external connectors; and obtaining, as represented in Block 1006, one or more machined silicon fasteners 824 (if silicon wafers are used), wherein the silicon wafers are fastened together with the integrated circuit 400 between the input waveguide 202 and the output waveguide 204, by insertion of the micromachined silicon fasteners 824 into the fastening holes in each of the wafers.

The method can also further comprise selecting the adequate number of wafers 800a-h, and adequate thickness, length L and width W of the silicon 800a-h (or metal) wafers so that all the waveguide structures, alignment elements, fastening elements, connectors can fit in the minimum possible volume for compactness FIG. 9 and FIG. 10 can also illustrate forming DC bias lines on the silicon wafer or metal plates to bias the Schottky diodes; aligning and assembling the chip within the waveguide housing, as shown in Block 1008 (silicon wafer or metal thin plates), wherein the input waveguide 104, 202, 804a-e inputs the electric field on the input antennas 402a within the chip 400, the output waveguides 204/806 receive the output electric field transmitted from all the output antennas 414 or E-probes, and the integrated circuit generally positioned in a plane perpendicular to a longitudinal axis or E-plane of the input 104 and output 108 waveguides.

The method of FIG. 10 can fabricate the device comprising the input waveguide matching network, i.e. waveguide matching sections 804a-e of different length and height to optimally couple the exciting electric field in the millimeter-wave, submillimeter-wave or terahertz range into the antennas or E-probes 402a within the chip 400 while guaranteeing a broadband frequency operation.

The method of FIG. 10 can fabricate the device comprising an output waveguide matching network 806, i.e. waveguide matching sections 806 of different length and height to optimally couple the output electric field (multiplied by the Schottky diodes 408) in the millimeter-wave, submillimeter-wave or terahertz range out of the while guaranteeing a broadband frequency operation.

The waveguide structures can be formed either on one or more aligned Silicon wafers 800a-e, 800g-h using deep reactive ion etching techniques (DRIE) and subsequent gold plating Block 1004, FIG. 8, or, for low frequencies of operation, on aligned thin metal plates using traditional CNC milling techniques. The different wafers 800a-h are arranged vertically, along the axis perpendicular to the chip 400 plane to allow for a 3D integration capability. The input 104 and output 108 waveguide are generally placed perpendicular to the chip 100, 400 so that the input 402a and output 414 probes are in-phase with the fundamental mode of propagation in the input 104 and output 108 waveguide. Only in one configuration, the dual on-chip power-combined frequency multiplier topology with the two multiplying structures mirrored along a same axis, the E-plane of the input and output waveguides can be the same as the chip plane.

A total thickness of the device including the metal lines and the support substrate can be 3 um-50 um, and the total dimension of the device can be less than 3 mm×2 mm.

The operation frequency can be at the millimeter-wave, submillimeter-wave or terahertz range depending on the size and structure of the Schottky diodes 408 employed (see FIG. 9(a), the specific dimensions of the input 404 and output 410 matching structures on-chip 400 and the dimensions of the input 804a-e/202 and output 806/204a-b waveguides. The typical operation bandwidth is around 17%, but can be lower or higher depending of the specific needs.

Two independent waveguide outputs 204a-b are inherently available so that the invention can feed two higher frequency multiplier stages or two frequency mixers or detectors without the need of additional waveguide based power dividers. The two outputs 204a-b can be combined using a simple waveguide Y-junction 806/114b if one single output is desired.

The method can further comprise a previous design phase, comprising, for the desired input power, efficiency and operation frequency and bandwidth within the millimeter-wave, submillimeter-wave or terahertz range: (a) selecting a number of Schottky diodes 408 and its size and layer structure (see FIG. 9(a)); (b) designing the stripline matching elements 404, 410 within the chip as well as the input 402a and output E-probes 414, and (c) designing the input 804a-e/202 and output 806/204a-b waveguide matching network.

Advantages and Improvements

The design of Schottky based multipliers at these frequency ranges is mainly constrained by the shrinkage of the waveguide dimensions with frequency and the minimum diode mesa sizes, which limits to two the maximum number of diodes per chip. Hence, multiple chip power-combined schemes become necessary to increase the power-handling capabilities of high-frequency multipliers. However, using separate chips and traditional power-combining schemes to enhance the power capabilities is extremely complicated at very high frequencies due to the impossibility of guaranteeing a perfect alignment and symmetry of the chips. Note that chips can have dimensions below 300 μm×50 μm at signal/electric field frequencies over 1.5 THz.

One or more embodiments of the power-combining scheme of the present invention takes advantage of the possibilities offered by the Silicon micromachining, not only from a geometrical point of view (i.e. the possibility of placing the transmission waveguides following different longitudinal axis), but also from the point of view of accuracy. Since the power-combining is performed 'on chip', the electrical path of the signal can be reduced almost by a factor of 10 with regard to traditional power-combining schemes based on regular micro-machining and Y-junctions and/or hybrid couplers, along with subsequent reduction in the waveguide losses. In addition, since the four multiplying structures 208 are on a single chip, the circuit symmetry and alignments are no longer determined by the tolerances involved in the regular metal block micro-machining and the subsequent manual assembly of the chips, but by the superior accuracy provided by Silicon-micromachining and the MMIC micro-fabrication process at JPL's Micro Devices Laboratory (MDL).

The use of Silicon micromachining instead of metal milling also makes it possible to considerably reduce the mass and volume of the multipliers.

Embodiments of the present invention can enable high-power all-solid state terahertz local oscillator sources for multi-pixel spectroscopy at 1.9 THz and 2.7 THz, for example. Embodiments of the present invention can extend the use of Schottky technology up to at least 4.7 THz, for example.

A novelty of the invention is that the power-combining is performed directly on chip contrarily to the traditional power-combining schemes. The two or more input antennas or E-probes divide the input signal equally among the multiplying structures within the chip and re-combine it at the output using the same concept. An improvement in power-handling capabilities and output power of a factor equal to the number of multiplying structures included in the chip is achieved.

References

The following references are incorporated by reference herein.

[1] A. Maestrini, J. Ward, J. Gill, C. Lee, B. Thomas, R. Lin, G. Chattopadhyay and I. Mehdi, "A frequency-multiplied source with more than 1mW of power across the 840-900-GHz band", IEEE Trans. on Microwave Theory and Tech., Vol. 58, No. 7, pp. 1925-1931, July 2007.

[2] I. Mehdi, B. Thomas, R. Lin, A. Maestrini, J. Ward, E. Schlecht, J. Gill, C. Lee, G. Chattopadhyay, and F. Maiwald, "High-power local oscillator sources for 1-2 THz", in Proc. SPIE, 7741, 774112 (2010).

[3] G. Chattopadhyay, I. Mehdi, J. Ward, E. Schlecht, A. Skalare, and P. H. Siegel, "Development of Multi-Pixel Heterodyne Array Instruments at Submillimeter Wavelengths," Proc. of the Asia Pacific Microw. Conf., December 2004.

[4] J. V. Siles, A. Maestrini, B. Alderman, S. Davies, H. Wang, J. Treuttel, E. Leclerc, T. Narhi and C. Goldstein, "A single-waveguide in-phase power-combined frequency doubler at 190 GHz", IEEE Microwave and Wireless Components Letters, Vol. 21, No. 6, pp. 332-334, June 2011

[5] C. Jung, C. Lee, B. Thomas, G. Chattopadhyay, A. Peralta, R. Lin, J. Gill and I. Mehdi, "Silicon micro-machining technology for THz applications", 35th Int. Conf. on Infrared, Millimeter and Terahertz waves, September 2010.

[6] A. Maestrini, J. Ward, J. Gill, H. Javadi, E. Schlecht, C. Tripon-Canseliet, G. Chattopadhyay and I. Mehdi, "A 540-640 GHz High Efficiency Four Anode Frequency Tripler," IEEE Trans. Microwave Theory Tech, Vol. 53, pp. 2835-284, September 2005.

[7] A. Maestrini, J. Ward, C. Tripon-Canseliet, J. Gill, C. Lee, H. Javadi, G. Chattopadhyay, and I. Mehdi, "In-Phase Power-Combined Frequency Triplers at 300 GHz", IEEE Microwave and Wireless Component Letters, Vol. 18, no. 3, pp. 218-220, March 2008

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Monolithic Microwave Integrated Circuit (MMIC) on-chip power-combined frequency multiplier device, comprising:
    an integrated circuit comprising two or more multiplying structures integrated on a single chip, wherein:
    each of the integrated multiplying structures are electrically identical and each of the multiplying structures include:
        one input antenna or input E-probe for receiving an input signal in the millimeter-wave, submillimeter-wave, or terahertz frequency range inputted on the chip,
        one or more stripline based input matching networks electrically connecting the input antenna or the input E-probe to two or more Schottky diodes in a balanced configuration,
        the two or more Schottky diodes used as nonlinear semiconductor devices to generate harmonics out of the input signal and produce a multiplied output signal,
        one or more stripline based output matching networks for transmitting the multiplied output signal from the Schottky diodes to an output antenna or an output E-probe, and
        the output antenna or the output E-probe for transmitting the multiplied output signal off the single chip into an output waveguide comprising a transmission line;
    two or more of the input antennas or input E-probes divide the input signal equally among the multiplying structures within the chip;
    two or more of the output antennas or output E-probes combine the output signals at the output waveguide; and
    an improvement in power-handling capabilities and output power of a factor equal to a number of the multiplying structures included in the chip is achieved.

2. The device of claim 1, wherein the integrated circuit comprises:
    the input antennas and output antennas including millimeter-wave, submillimeter-wave, or terahertz stripline antennas,
    the stripline based input and output matching networks including transmission lines,
    the Schottky diodes that are semiconductor devices, and
    the millimeter-wave, submillimeter-wave, or terahertz stripline antennas, the transmission lines, and the semiconductor devices lithographically patterned on a semi-insulating semiconductor substrate and deposited on a plated silicon-wafer based housing or a metal-plated block.

3. The device of claim 2, further comprising:
    an input waveguide including a matching network including one or more waveguide matching sections of different length and height to optimally couple the input signal, comprising an exciting electric field in the millimeter-wave, submillimeter-wave, or terahertz range, into the input antennas or E-probes within the chip while guaranteeing a broadband frequency operation; and
    the output waveguide including a matching network comprising one or more waveguide matching sections of different length and height to optimally couple the multiplied output signal, comprising an electric field in the millimeter-wave, submillimeter-wave or terahertz range, out of the chip while guaranteeing a broadband frequency operation.

4. The device of claim 3, wherein:
    the input and output waveguide matching sections can be formed either on:
        one or more aligned Silicon wafers using deep reactive ion etching techniques (DRIE) and subsequent gold plating, or
        for lower frequencies of operation, on aligned thin metal plates using traditional CNC milling techniques; and
    the different wafers or plates are arranged vertically, along an axis perpendicular to the chip plane, to allow for a 3D integration capability.

5. The device of claim 4, wherein the input and output waveguides are placed perpendicular to the chip so that the input and output E-probes are in-phase with the fundamental mode of propagation in the input and output waveguides.

6. The device of claim 4, wherein:
    the chip comprises a dual on-chip power-combined frequency multiplier topology where the two multiplying structures are mirrored along a same axis, and
    an E-plane of the input and output waveguides is the same as the chip plane.

7. The device of claim 2, further comprising:
    direct current (DC) bias lines using beamleads disposed to bias each of the Schottky diodes, wherein:
    the integrated circuit and DC bias lines are connected to external bias lines that are formed directly on the silicon wafer based housing that includes a waveguide channel where the chip is located, or otherwise using wire-bonded capacitors placed on the waveguide channel.

8. The device of claim 7, wherein:
a total thickness of the device including metal DC bias lines and the substrate for the chip is in a range of 3 micrometers-50 micrometers, and
a total dimension of the device is less than 3 millimeters by 2 millimeters.

9. The device of claim 2, wherein:
an operation frequency of the device is at a millimeter-wave, submillimeter-wave, or terahertz range depending on a size and structure of the Schottky diodes employed, specific dimensions of the input and output matching networks on-chip, and dimensions of the input and output waveguides, and
operation bandwidth is around 17%, higher than 17%, or lower than 17%.

10. The device of claim 2, comprising:
two independent waveguide outputs so that the device can feed two higher frequency multiplier stages or two frequency mixers or detectors without a need of additional waveguide based power dividers, wherein the two waveguide outputs can be combined using a simple waveguide Y-junction if one single output is desired.

11. The device of claim 2, wherein:
the integrated circuit includes at least one pair of the balanced Schottky diodes per multiplying structure, including at least two pairs for a dual on-chip multiplier configuration or at least four pairs for a quad on-chip multiplier configuration; and
the Schottky diodes are nonlinear semiconductor devices that generate one or more harmonics of the input signal so that the input signal is multiplied up in frequency.

12. The device of claim 2, wherein the integrated circuit has a pattern that is symmetric about at least two axes passing through a central point of the integrated circuit.

13. A method for fabricating an integrated circuit or chip including a Monolithic Microwave Integrated Circuit (MMIC) on-chip power-combined frequency multiplier device, comprising:
fabricating an integrated circuit comprising two or more multiplying structures integrated on a single chip, wherein each of the integrated multiplying structures are electrically identical and fabricating each of the multiplying structures includes:
defining two or more Schottky diodes, wherein:
the defining of each of the Schottky diodes includes defining a Schottky diode ohmic contact and mesa on a substrate, and
the Schotty diodes are used as nonlinear semiconductor devices to generate harmonics out of an input signal and produce a multiplied output signal;
forming interconnect metal comprising one or more stripline based input matching networks and one or more stripline based output matching networks, and input and output antennas or E-probes, the one or more stripline based input matching networks electrically connecting an input antenna or an input E-probe to the two or more Schottky diodes in a balanced configuration, the one or more stripline based output matching networks for transmitting the multiplied output signal from the Schottky diodes to an output antenna or an output E-probe, the input antenna or input E-probe for receiving the input signal in the millimeter-wave, submillimeter-wave, or terahertz frequency range inputted on the chip, and the output antenna or the output E-probe for transmitting the multiplied output signal off the single chip into one or more output waveguides each comprising a transmission line;
defining and depositing Schottky anodes using electron beam lithography;
defining bridge metal that connects the Schottky diodes to the interconnect metal;
passivating the integrated circuit;
etching the substrate to form a membrane layer;
depositing ground and DC bias airbridges for the Schottky diodes;
attaching the chip comprising the interconnect metal and the Schottky diodes onto a carrier wafer;
removing the substrate with a selective etch;
releasing the chip from the carrier wafer; and
assembling the chip into a plated silicon-wafer based housing or thin metal plates-based housing;
wherein:
two or more of the input antennas or input E-probes divided the input signal equally among the multiplying structure with the chip;
two or more of the output antennas or output E-probes combine the output signals at the one or more output waveguides,
power-combining of the output signals is performed directly on chip; and
an improvement in power-handling capabilities and output power of a factor equal to a number of the multiplying structures included in the chip is achieved.

14. The method of claim 13, further comprising:
forming DC bias lines on the silicon wafer based housing or metal plates-based housing to bias the Schottky diodes;
aligning and assembling the chip within a waveguide housing comprising one or more silicon wafers or thin metal plates, wherein:
the waveguide housing includes an input waveguide that inputs an electric field on the input antennas within the chip,
the waveguide housing includes the one or more output waveguides that receive an output electric field transmitted from all the output antennas or E-probes, and
the integrated circuit is positioned in a plane perpendicular to a longitudinal axis or E-plane of the input and output waveguides.

15. The method of claim 14, further comprising a previous design phase comprising, for a desired input power, efficiency and operation frequency and bandwidth within the millimeter-wave, submillimeter-wave, or terahertz range:
selecting a number of the Schottky diodes, a size of each of the Schottky diodes, and a layer structure of each of the Schottky diodes;
designing stripline matching elements comprising the stripline based input matching networks and the stripline based output matching networks within the chip;
designing the input and output E-probes; and
designing input and output waveguide matching networks for the input and output waveguides.

16. A method of fabricating a Monolithic Microwave Integrated Circuit (MMIC) on-chip power-combined frequency multiplier device, comprising:
fabricating an integrated circuit comprising two or more multiplying structures integrated on a single chip, wherein each of the integrated multiplying structures are electrically identical and fabricating each of the multiplying structures includes:

fabricating one input antenna or input E-probe for receiving an input signal in the millimeter-wave, sub-millimeter-wave, or terahertz frequency range inputted on the chip, fabricating one or more stripline based input matching networks electrically connecting the input antenna or the input E-probe to two or more Schottky diodes in a balanced configuration, fabricating the two or more Schottky diodes that are used as nonlinear semiconductor devices to generate harmonics out of the input signal and produce a multiplied output signal, fabricating one or more stripline based output matching networks for transmitting the multiplied output signal from the Schottky diodes to an output antenna or an output E-probe, and fabricating the output antenna or the output E-probe for transmitting the multiplied output signal off the single chip an output waveguide transmission line comprising output waveguide matching networks; and micro-machining a plurality of silicon wafers or thin metal plates including input and output waveguide matching networks as well as a waveguide channel where the frequency multiplier chip or integrated circuit is placed, wherein the silicon wafers or thin metal plates are aligned, stacked, and fastened together using alignment pins, screw holes or any other alignment technique;

wherein:
two or more of the input antennas or input E-probes divided the input signal equally among the multiplying structure within the chip;

two or more of the output antennas or output E-probes combine the output signals at the output waveguides transmission line, power-combining of the output signals is performed directly on chip; and an improvement in power-handling capabilities and output power of a factor equal to a number of the multiplying structures included in the chip is achieved.

17. The method of claim 16, further comprising:
machining one or more fastening holes in each of the silicon wafers or metal plates, machining mount holes in one or more of the silicon wafers or metal plates for external connectors; and obtaining one or more micro-machined silicon fasteners, if silicon wafers are used, wherein the silicon wafers are fastened together with the integrated circuit between an input waveguide and the output waveguide transmission line, by insertion of the micro machined silicon fasteners into the fastening holes in each of the wafers.

18. The method of claim 16, further comprising selecting an adequate number of the silicon wafers or metal plates, and an adequate thickness, length and width of the silicon wafers or metal plates so that all waveguide structures, alignment elements, fastening elements, connectors can fit in a minimum possible volume for compactness.

* * * * *